(12) United States Patent
Ide

(10) Patent No.: US 9,025,971 B2
(45) Date of Patent: May 5, 2015

(54) OPTICAL RECEIVING CIRCUIT

(71) Applicant: Fujitsu Limited, Kawasaki-shi, Kanagawa (JP)

(72) Inventor: Satoshi Ide, Yokohama (JP)

(73) Assignee: Fujitsu Limited, Kawasaki (JP)

( * ) Notice: Subject to any disclaimer, the term of this patent is extended or adjusted under 35 U.S.C. 154(b) by 29 days.

(21) Appl. No.: 14/092,125

(22) Filed: Nov. 27, 2013

(65) Prior Publication Data

US 2014/0193164 A1 Jul. 10, 2014

(30) Foreign Application Priority Data

Jan. 10, 2013 (JP) ................................. 2013-002767

(51) Int. Cl.
*H04B 10/06* (2006.01)
*H04B 10/69* (2013.01)

(52) U.S. Cl.
CPC ........ *H04B 10/6933* (2013.01); *H04B 10/6971* (2013.01); *H04B 10/6931* (2013.01)

(58) Field of Classification Search
CPC ........ H04B 10/60; H04B 10/66; H04B 10/69; H04B 10/693; H04B 10/6931; H04B 10/6933; H04B 10/695; H04B 10/6971
USPC .......................................... 398/202, 208–210
See application file for complete search history.

(56) References Cited

U.S. PATENT DOCUMENTS

| | | | | |
|---|---|---|---|---|
| 5,311,353 | A | * | 5/1994 | Crawford ...................... 359/333 |
| 5,430,766 | A | * | 7/1995 | Ota et al. ...................... 375/318 |
| 5,793,256 | A | | 8/1998 | Nagahori et al. |
| 2006/0007806 | A1 | * | 1/2006 | He et al. ...................... 369/44.34 |
| 2008/0310273 | A1 | * | 12/2008 | Ma et al. ...................... 369/53.17 |
| 2009/0232519 | A1 | * | 9/2009 | Ide et al. ...................... 398/209 |
| 2009/0315626 | A1 | | 12/2009 | Bowler et al. |
| 2013/0342275 | A1 | * | 12/2013 | Takemoto et al. ............ 330/254 |

FOREIGN PATENT DOCUMENTS

| | | |
|---|---|---|
| JP | 08-279717 | 10/1996 |
| JP | 2003-168933 | 6/2003 |
| JP | 2011-525777 | 9/2011 |

OTHER PUBLICATIONS

"*10-Gb/s 850-nm CMOS OEIC Receiver with a Silicon Avalanche Photodetector*"; Youn et al., IEEE Journal of Quantum Electronics, vol. 48, No. 2, pp. 229-236, Feb. 2012.

\* cited by examiner

*Primary Examiner* — Dalzid Singh
(74) *Attorney, Agent, or Firm* — Staas & Halsey LLP

(57) ABSTRACT

An optical receiving circuit includes: a first non-feedback amplifier configured to convert a current signal, obtained from a light receiving element in response to an optical signal, into a first voltage signal; a second amplifier configured to convert an input current signal into a second voltage signal, the output signal not being directly fed back to an input side; a differential amplifier configured to perform differential amplification on the first voltage signal and the second voltage signal and to output an in positive signal and a negative signal obtained through the differential amplification; and an offset compensation circuit configured to input, on the basis of the in positive signal and the negative signal output from the differential amplifier, an offset current signal in accordance with an offset of a level of the in positive signal from a level of the negative signal to the second amplifier.

13 Claims, 20 Drawing Sheets

OPTICAL RECEIVING CIRCUIT

CROSS-REFERENCE TO RELATED APPLICATION

This application is based upon and claims the benefit of priority of the prior Japanese Patent Application No. 2013-002767 filed on Jan. 10, 2013, the entire contents of which are incorporated herein by reference.

FIELD

The embodiments discussed herein are related to an optical receiving circuit.

BACKGROUND

In recent years, the speed and the capacity of signal transfer between central processing units (CPUs) of high-end servers or super-computers have been increased. Accordingly, in order to break through the limitation of electrical signal transfer, an optical interconnect using high speed optical transmission technology for a short range or middle range inter-CPU transmission has been attempted to be used.

An optical interconnect includes, for example, an optical transceiver that converts an electrical signal into an optical signal. For example, the optical interconnect transmits data in the form of an optical signal between a transmitter optical transmission device and a receiver optical transmission device via a transmission line, such as an array optical fiber. An example of an optical transmission unit for optical transmission is a vertical cavity surface emitting laser (VCSEL). VCSEL is a compact and low-power-consumption laser element capable of directly modulating an electrical current. In addition, an example of an optical receiving unit for optical transmission is a photodiode (PD) that receives an optical signal and converts the optical signal into an electrical signal. In order to support wide-band signal transmission between CPUs, high-speed optical transmission (e.g., 25 Gb/s) is employed.

In addition, in optical interconnects, a multimode fiber (MMF) that facilitates array-structured optical connection is employed as an optical transmission line, for example. In general, the diameter of the core of an MMF is 50 micrometers. In order to achieve optical connection with an MMF, there is a limit to reduce the detector diameter of a PD, which is an optical receiving device. As a result, it is difficult to reduce the parasitic capacitance and, thus, it is difficult to increase the bandwidth of the PD. Accordingly, in order to achieve a higher-speed optical receiving circuit, it is effective to use an equalizer that compensates for the bandwidth of the PD through equalization.

For example, an optical receiving circuit including a grounded-base amplifier circuit connected to a photodiode and a dummy circuit for generating a reference signal has been developed as an optical receiving circuit used for an optical receiver (refer to, for example, Japanese Laid-open Patent Publication No. 8-279717). In addition, as an equalizer connected to a transimpedance amplifier (TIA), an equalizing circuit having a transfer function that is the inverse number of a transfer function of the pole and zero of the upstream amplifier has been developed (refer to, for example, Japanese National Publication of International Patent Application No. 2011-525777).

Furthermore, an optical receiver including a circuit that reduces an amount of offset of a limit amplifier circuit in the final stage among a plurality of limit amplifier circuits has been developed (refer to, for example, Japanese Laid-open Patent Publication No. 2003-168933). Still furthermore, an optical receiver including a feedback TIA that immediately feeds back part of a signal output from a differential amplifier circuit to the input, a dummy PD that inputs a negative signal output from the differential amplifier circuit, and an equalizer connected downstream of the TIA has been developed (refer to, for example, Jin-Sung Youn et al., "10-Gb/s 850-nm CMOS OEIC Receiver with a Silicon Avalanche Photodetector", IEEE JOURNAL OF QUANTUM ELECTRONICS, VOL. 48, NO. 2, FEBRUARY 2012, pp. 229-236).

In addition, as an optical receiving circuit for high-speed optical transmission, such as optical interconnect, a differential optical receiving circuit having a high resistance to crosstalk from a neighboring channel even in an array structure can be used, for example.

As an example of an input waveform and an output waveform of an existing differential optical front-end, an input waveform and an output waveform used in "10-Gb/s 850-nm CMOS OEIC Receiver with a Silicon Avalanche Photodetector" are described below with reference to FIG. 24. FIG. 24 illustrates, as a reference, an example of an output waveform of a differential optical front-end using a feedback TIA. For example, in the case of large signal input, an input signal is a 600-Opp signal. For example, when such a feedback TIA is used in a differential optical front-end, a dummy PD that receives a negative signal output from a differential amplifier circuit is connected to the differential optical front-end.

In FIG. 24, the abscissa represents the time (nanosec), and the ordinate represents the voltage (V). As illustrated in FIG. 24, each of a positive signal 2421 and a negative signal 2422 output from the differential optical front-end has a waveform shifted to one side and, thus, is non-symmetrical. The negative signal is a signal which has the positive signal reversed. Accordingly, the amplifier circuit has an output that has high linearity in the middle of the output range and its vicinity. In contrast, in the upper or lower limit region or its vicinity, the output is saturated. As a result, in particular, on a logic-1 side where the output is close to its upper or lower limit, an output signal tends to be non-linear.

To perform equalization using an equalizer, a signal is to be linearly amplified. However, according to the above-described existing technology, the input and output characteristics of a signal in a differential amplifier circuit is non-linear. Accordingly, it is difficult to improve the optical receiving characteristic using an equalizer, which is problematic.

SUMMARY

According to an aspect of the embodiments, an optical receiving circuit includes: a first non-feedback amplifier configured to convert a current signal, obtained from a light receiving element in response to an optical signal, into a first voltage signal; a second amplifier configured to convert an input current signal into a second voltage signal, the output signal not being directly fed back to an input side; a differential amplifier configured to perform differential amplification on the first voltage signal and the second voltage signal and to output an in positive signal and a negative signal obtained through the differential amplification; and an offset compensation circuit configured to input, on the basis of the in positive signal and the negative signal output from the differential amplifier, an offset current signal in accordance with an offset of a level of the in positive signal from a level of the negative signal to the second amplifier.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Exemplary embodiments of the present technology are described in detail below with reference to the accompanying drawings.

Figure 1:
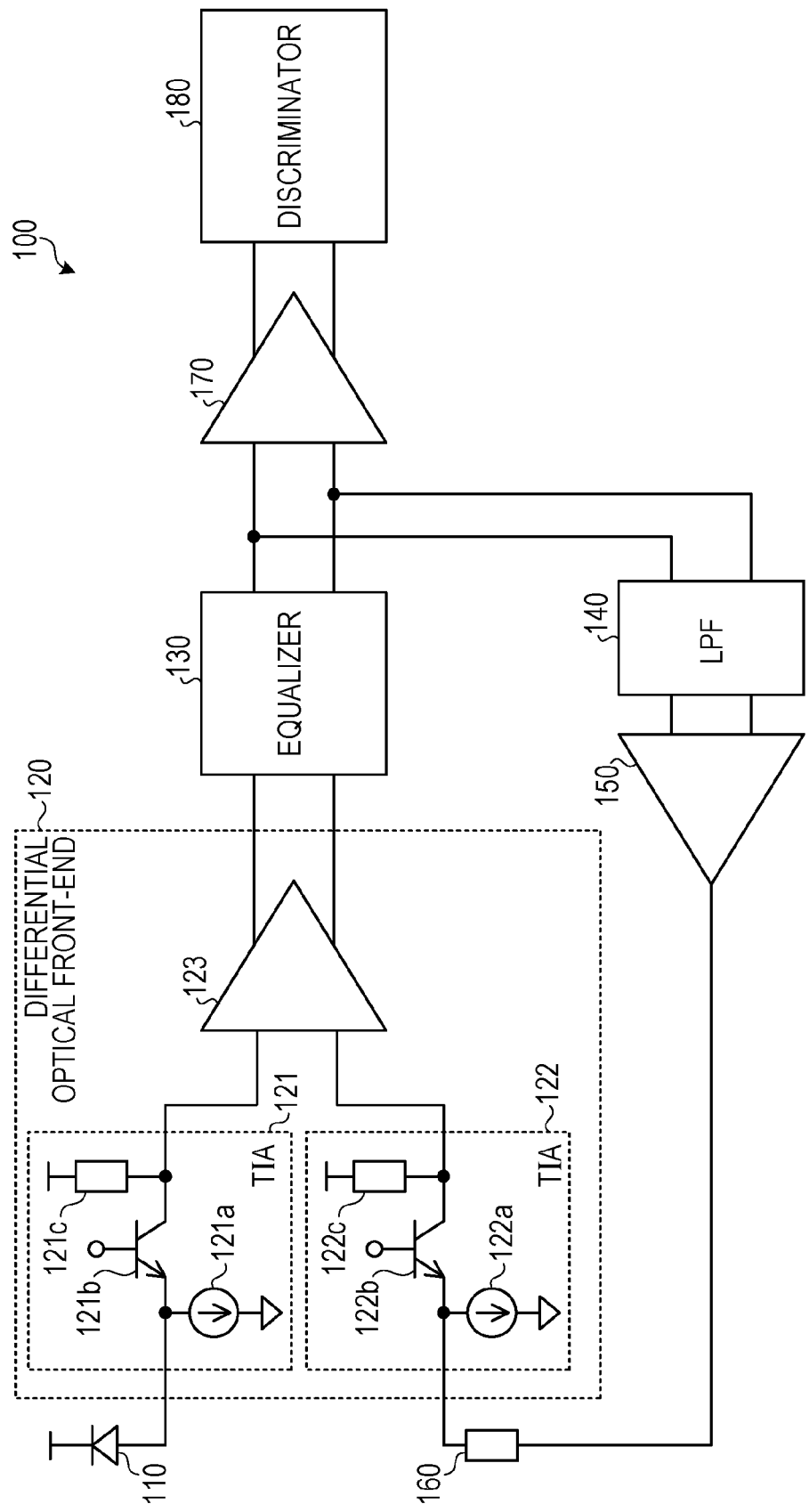
FIG. 1 illustrates an example (a first example) of the configuration of an optical receiving circuit.

FIG. 1 illustrates an example (a first example) of the configuration of an optical receiving circuit. As illustrated in FIG. 1, an optical receiving circuit 100 includes a photodiode 110, a differential optical front-end 120, an equalizer 130, a low-pass filter (LPF) 140, an offset compensation amplifier 150, an offset compensation resistor 160, an output buffer circuit 170, and a discriminator 180. The photodiode 110 converts, for example, an optical signal output from an optical transmission line into an electrical signal and outputs the converted electrical signal to the differential optical front-end 120.

The differential optical front-end 120 includes a TIA 121, a TIA 122, and a differential amplifier circuit 123.

The TIA 121 is of a non-feedback type that does not feedback the output to the input. In addition, the TIA 121 is of a grounded-base type. For example, the TIA 121 includes a current source 121a, a bipolar transistor 121b, and a load resistor 121c. The current source 121a is connected to a point between the input end of the TIA 121 and the emitter of the bipolar transistor 121b.

The emitter of the bipolar transistor 121b is connected to the input end of the TIA 121 and the current source 121a. A collector of the bipolar transistor 121b is connected to the load resistor 121c and the output end of the TIA 121. The base of the bipolar transistor 121b is connected to an appropriate bias voltage. One end of the load resistor 121c is connected to a point between the bipolar transistor 121b and the differential amplifier circuit 123.

The TIA 121 having such a configuration converts an electrical signal (an electrical current signal) output from the photodiode 110 into a voltage signal. The TIA 121 is connected to a non-inverting input terminal of the differential amplifier circuit 123. The TIA 121 outputs the electrical signal converted into a voltage signal to the non-inverting input terminal of the differential amplifier circuit 123. Thus, the TIA 121 can serve as a first non-feedback amplifier that converts a current signal indicating the result of reception of the optical signal performed by the photodiode 110 into a voltage signal and output the voltage signal. At that time, the output signal is not directly fed back to the input side.

The differential amplifier circuit 123 performs differential amplification on the basis of the electrical signal output from the TIA 121 and the electrical signal output from the TIA 122. Thereafter, the differential amplifier circuit 123 outputs a differential electrical signal obtained through the differential amplification to the equalizer 130. Thus, the differential amplifier circuit 123 can serve as a differential amplifier that performs differential amplification of the voltage signal output from the TIA 121 and the voltage signal output from the TIA 122 and outputs an in positive signal and the negative signal obtained through the differential amplification.

The equalizer 130 performs equalization on the electrical signal output from the differential amplifier circuit 123. For example, the equalizer 130 has a characteristic in which the gain in a high-frequency region is higher than that in a low-frequency region. For example, the equalizer 130 controls the frequency characteristic so as to restore the waveform of an electrical signal output from the differential amplifier circuit 123 or minimize a variation of the waveform. The equalizer 130 outputs the electrical signal subjected to equalization to the LPF 140 and the output buffer circuit 170. Thus, the equalizer 130 can serve as an equalization unit that performs equalization of the in positive signal and the negative signal output from the differential amplifier circuit 123. More specifically, for example, the equalizer 130 can use one of equalizer circuits described in example configurations below.

Among the electrical signals output from the equalizer 130, the LPF 140 allows a frequency component lower than or equal to the cutoff frequency to pass therethrough to the offset compensation amplifier 150 and blocks a frequency component higher than the cutoff frequency. Thus, the LPF 140 can serve as an extraction unit that extracts only low frequency components that are lower than or equal to a predetermined frequency among the in positive signals and the negative signals output from the differential amplifier circuit 123.

The offset compensation amplifier 150 and the offset compensation resistor 160 compensate for an offset between the levels of the in positive signal and the negative signal output from the differential optical front-end 120 on the basis of the electrical signal output from the LPF 140.

More specifically, the offset compensation amplifier 150 amplifies the electrical signal output from the LPF 140 and outputs the electrical signal to the offset compensation resistor 160. Thus, the offset compensation amplifier 150 can serve as an offset amplifier that performs differential amplification of each of the components of the in positive signals and the negative signals extracted by the LPF 140.

The offset compensation resistor 160 converts the voltage signal output from the offset compensation amplifier 150 into a current signal. Thereafter, the offset compensation resistor 160 outputs the converted current signal to the TIA 122. Thus, the offset compensation resistor 160 can serve as a resistor disposed in series between the offset compensation amplifier 150 and the TIA 122.

In addition, the LPF 140, the offset compensation amplifier 150, and the offset compensation resistor 160 can serve as an offset compensation unit that inputs an offset current signal to the TIA 122 on the basis of the in positive signal and the negative signal output from the differential amplifier circuit 123. The offset current signal operates to compensate for the offset between the levels of the in positive signal and the negative signal. The offset current signal corresponds to about the average value of the electrical signals input from the photodiode 110.

The TIA 122 is a non-feedback TIA in which the output is not fed back to the input. In addition, the TIA 122 is a grounded-base TIA. For example, the TIA 122 includes a current source 122a, a bipolar transistor 122b, and a load resistor 122c. The current source 122a is connected to a point between the input end of the TIA 122 and the emitter of the bipolar transistor 122b.

The emitter of the bipolar transistor 122b is connected to the input end of the TIA 122 and the current source 122a. The collector of the bipolar transistor 122b is connected to the load resistor 122c and the output end of the TIA 122. The base of the bipolar transistor 122b is connected to an appropriate bias voltage. One end of the load resistor 122c is connected to a point between the bipolar transistor 122b and the differential amplifier circuit 123. Thus, the TIA 122 can serve as a second non-feedback amplifier that converts an input current signal into a voltage signal and outputs the voltage signal. At that time, the output signal is not directly fed back to the input side.

The TIA 122 having such a configuration can convert the electrical signal output from the offset compensation resistor 160 into a voltage signal. The TIA 122 is connected to an inverting input terminal of the differential amplifier circuit 123. The TIA 122 outputs the electrical signal converted into a voltage signal to the inverting input terminal of the differential amplifier circuit 123.

The output buffer circuit 170 amplifies the electrical signal output from the equalizer 130 to a predetermined signal level and outputs the electrical signal to the discriminator 180. For example, the output buffer circuit 170 provides impedance matching to the transmission line of the electrical signal output to the discriminator 180.

The discriminator 180 discriminates data signals output from the output buffer circuit 170. For example, for a non-return-to-zero (NRZ) signal, if a difference voltage between the in positive signal and the negative signal output from the output buffer circuit 170 is positive, the discriminator 180 determines that the result is "1". However, if the difference voltage is negative, the discriminator 180 determines that the result is "0". Thereafter, the discriminator 180 outputs the result of determination. For example, the discriminator 180 includes a clock reproduction circuit and a flip-flop. The discriminator 180 reproduces the clock from the data signal and makes logical decisions at the timing of the reproduced clocks using the flip-flop.

As illustrated in FIG. 1, the optical receiving circuit 100 includes the non-feedback TIAs 121 and 122 and the offset compensation unit for inputting an offset current signal to the TIA 122. Thus, the optical receiving circuit 100 can input the offset current signal to the TIA 122 without being influenced by negative feedback in the TIA and compensate for the offset of the output of the differential optical front-end. In this manner, the in positive signal and the negative signal output from the differential optical front-end 120 can be made symmetrical and, therefore, the linearity of a signal in the differential amplifier circuit 123 and the equalizer 130 can be improved. As a result, the bandwidth of the PD can be compensated for using equalization performed by the equalizer and, thus, the optical receiver characteristic can be improved.

Figure 2:
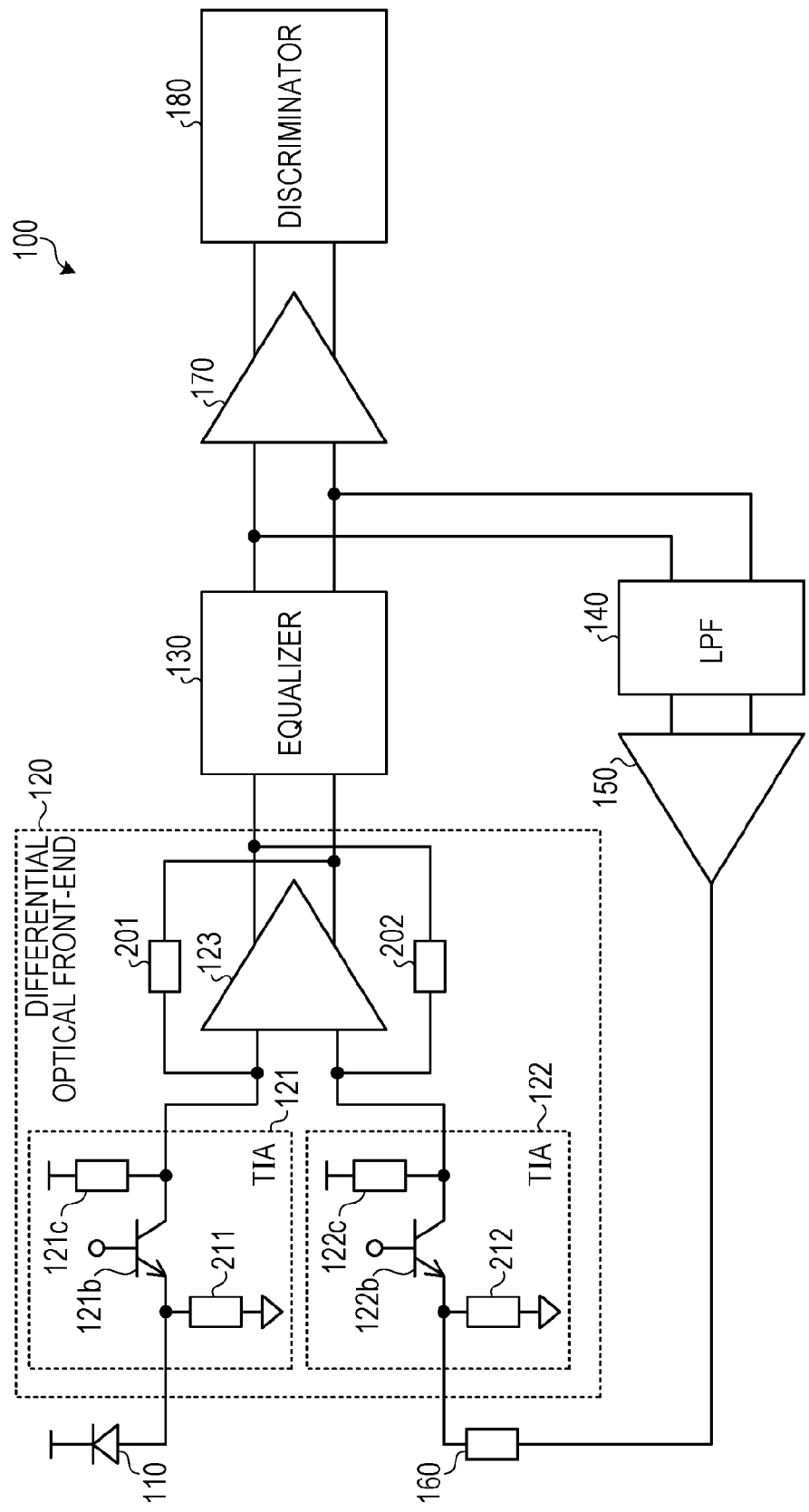
FIG. 2 illustrates an example (a second example) of the configuration of an optical receiving circuit.

FIG. 2 illustrates an example (a second example) of the configuration of an optical receiving circuit. In FIG. 2, the same reference symbols are used for the same configurations as in FIG. 1, and descriptions of the configurations are not repeated. As illustrated in FIG. 2, an optical receiving circuit 100 includes a differential optical front-end 120 having a configuration that differs from that in the optical receiving circuit 100 illustrated in FIG. 1. The differential optical front-end 120 includes the TIA 121, the TIA 122, the differential amplifier circuit 123, a feedback resistor 201, and a feedback resistor 202.

The TIA 121 includes a resistor 211. The resistor 211 is connected to a point between the input end of the TIA 121 and the emitter of the bipolar transistor 121b. In the TIA 121, the emitter of the bipolar transistor 121b is held at a stable electrical potential. If in this manner, a fixed voltage is applied, the resistor 211 functions as a current source of the TIA 121. Note that instead of the resistor 211, a transistor can be used.

Through such a configuration, the TIA 121 can convert the electrical signal output from the photodiode 110 into a voltage signal. The TIA 121 outputs the electrical signal converted into a voltage signal to the non-inverting input terminal of the differential amplifier circuit 123.

The TIA 122 includes a resistor 212. The resistor 212 is connected to a point between the input end of the TIA 122 and the emitter of the bipolar transistor 122b. In the TIA 122, the emitter of the bipolar transistor 122b is held at a stable potential. If in this manner, a fixed voltage is applied, the resistor 212 functions as a current source of the TIA 122. Note that instead of the resistor 212, a transistor can be used.

In addition, through such a configuration, the TIA 122 can convert the electrical signal output from the offset compensation resistor 160 into a voltage signal. The TIA 122 outputs the electrical signal converted into a voltage signal to the inverting input terminal of the differential amplifier circuit 123.

The feedback resistors 201 and 202 form a feedback circuit for correcting the frequency characteristic. The feedback resistors 201 and 202 are connected so as to feed back the output of the differential amplifier circuit 123 to the input. For example, one end of the feedback resistor 201 is connected to the non-inverting input terminal of the differential amplifier circuit 123, and the other end is connected to the inverting input terminal of the differential amplifier circuit 123. In addition, for example, one end of the feedback resistor 202 is connected to the inverting input terminal of the differential amplifier circuit 123, and the other end is connected to the non-inverting input terminal of the differential amplifier circuit 123.

The differential amplifier circuit 123 performs differential amplification on the basis of the electrical signal output from the TIA 121, the electrical signal output from the TIA 122, and the electrical signal output from the feedback circuit. Thus, the differential amplifier circuit 123 serves as a differential amplifier that provides negative feedback in which the output signal is fed back to the input side. In addition, the feedback resistors 201 and 202 serve as a feedback resistor disposed in series to the feedback path.

Through the configuration illustrated in FIG. 2, even the configuration having the TIA 121 using the resistor 211 and the TIA 122 using the resistor 212 can provide an advantage that is the same as in the configuration illustrated in FIG. 1. The current source using the resistor 211 and the resistor 212 can reduce the parasitic capacitance, although the stability of the current is low. By using such a configuration, a high speed operation can be provided.

In addition, by providing the feedback resistor 201 and the feedback resistor 202, a differential amplifier that provides negative feedback is achieved and, thus, a stable amplification gain can be obtained. The load resistor 121c and the feedback resistor 201 are connected in parallel and serve as a load of the TIA 121. In addition, the load resistor 122c and the feedback resistor 202 are connected in parallel and serve as a load of the TIA 122. As compared with the case in which only the load resistors 121c and 122c are used as a load (the first example of the configuration), a higher resistance value can be obtained. An input equivalent noise current caused by thermal noise of a resistor decreases with increasing resistance value. Accordingly, by increasing the resistance value of each of the load resistors 121c and 122c, the impact of thermal noise of a resistor can be reduced.

Figure 3:
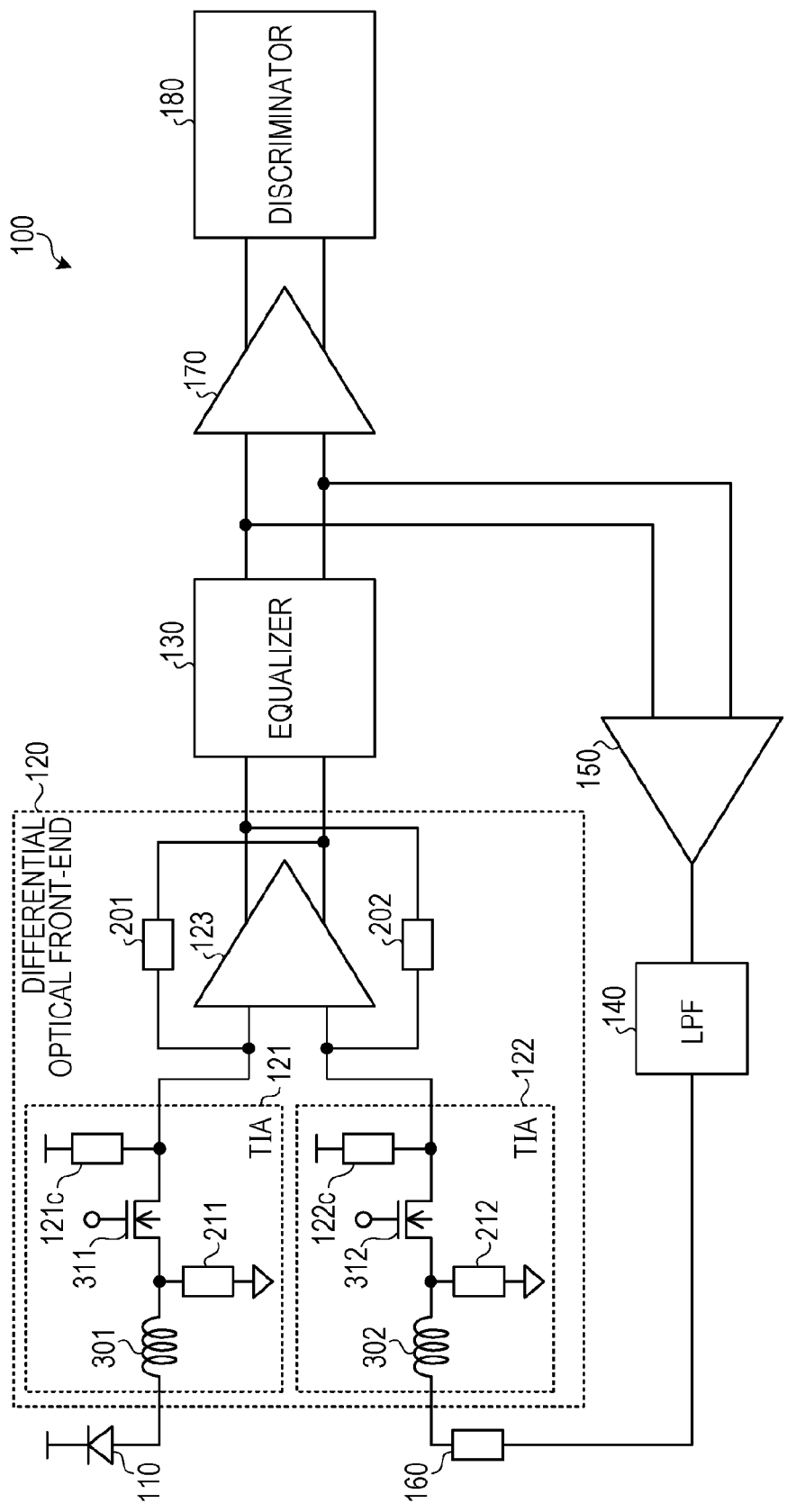
FIG. 3 illustrates an example (a third example) of the configuration of an optical receiving circuit.

FIG. 3 illustrates an example (a third example) of the configuration of an optical receiving circuit. In FIG. 3, the same reference symbols are used for the same configurations as in FIGS. 1 and 2, and descriptions of the configurations are not repeated. As illustrated in FIG. 3, an optical receiving circuit 100 includes the TIA 121 and the TIA 122 having configurations that differ from those in the optical receiving circuit 100 illustrated in FIG. 2. In addition, the layout of the LPF 140 and the offset compensation amplifier 150 differ from that in the optical receiving circuit 100 illustrated in FIG. 2. Note that the installation positions of the LPF 140 and the offset compensation amplifier 150 may be the same as those in the optical receiving circuit 100 illustrated in FIG. 2.

The TIA 121 is a grounded-gate TIA. The TIA 121 includes an inductor 301. The TIA 121 further includes a field effect transistor (FET) 311 instead of the bipolar transistor 121b illustrated in FIG. 2. The inductor 301 is provided in an input portion of the TIA 121. For example, the inductor 301 can be formed from a spiral inductor incorporated into an integrated circuit (IC) or a bonding wire outside the IC.

Through such a configuration, the TIA 121 can convert the electrical signal output from the photodiode 110 into a voltage signal. In addition, the TIA 121 is connected to the non-inverting input terminal of the differential amplifier circuit 123. The TIA 121 outputs the electrical signal converted into the voltage signal to the non-inverting input terminal of the differential amplifier circuit 123.

The TIA 122 is a grounded-gate TIA. The TIA 122 includes an inductor 302. The TIA 122 further includes an FET 312 instead of the bipolar transistor 122b illustrated in FIG. 2. The inductor 302 is provided in an input portion of the TIA 122. For example, the inductor 302 can be formed from a spiral inductor incorporated into an integrated circuit (IC) or a bonding wire outside the IC.

Through such a configuration, the TIA 122 can convert the electrical signal output from the offset compensation resistor 160 into a voltage signal. In addition, the TIA 122 is connected to the non-inverting input terminal of the differential amplifier circuit 123. The TIA 122 outputs the electrical signal converted into the voltage signal to the inverting input terminal of the differential amplifier circuit 123.

The equalizer 130 outputs the electrical signal subjected to equalization to the offset compensation amplifier 150 and the output buffer circuit 170. The offset compensation amplifier 150 amplifies the electrical signal output from the equalizer 130 and outputs the electrical signal to the LPF 140. Thus, the offset compensation amplifier 150 can serve as an offset amplifier unit that differential-amplifies the in positive signal and the negative signal output from the differential amplifier circuit 123 and outputs a signal obtained through the differential amplification.

Among the electrical signals output from the offset compensation amplifier 150, the LPF 140 allows a frequency component lower than or equal to the cutoff frequency to pass therethrough to the offset compensation resistor 160 and blocks a frequency component higher than the cutoff frequency. Thus, the LPF 140 can serve as an extraction unit that extracts only low frequency components that are lower than or equal to a predetermined frequency among the signals output from the offset compensation amplifier 150.

The offset compensation resistor 160 converts the voltage signal output from the LPF 140 into a current signal. The offset compensation resistor 160 outputs the converted current signal to the TIA 122. The offset compensation resistor 160 can serve as a resistor disposed in series between the LPF 140 and the TIA 122.

Through the configuration illustrated in FIG. 3, even the configuration having the TIA 121 using the FET 311 and the TIA 122 using the FET 312 can provide an advantage that is the same as in the configuration illustrated in FIG. 1. In addition, even the configuration in which the layout of the LPF 140 and the offset compensation amplifier 150 differs from that in FIG. 1 can provide an advantage that is the same as in the configuration illustrated in FIG. 1.

In addition, by providing the inductors 301 and 302 in the TIAs 121 and 122, respectively, the inductors 301 and 302 form a resonant circuit together with the parasitic capacitance of the transistor. The LC resonance can increase the electrical signal output from the photodiode 110 in the high-frequency region and, thus, reduce an adverse effect of noise (improve the signal/noise ratio) in the high-frequency region.

Figure 4:
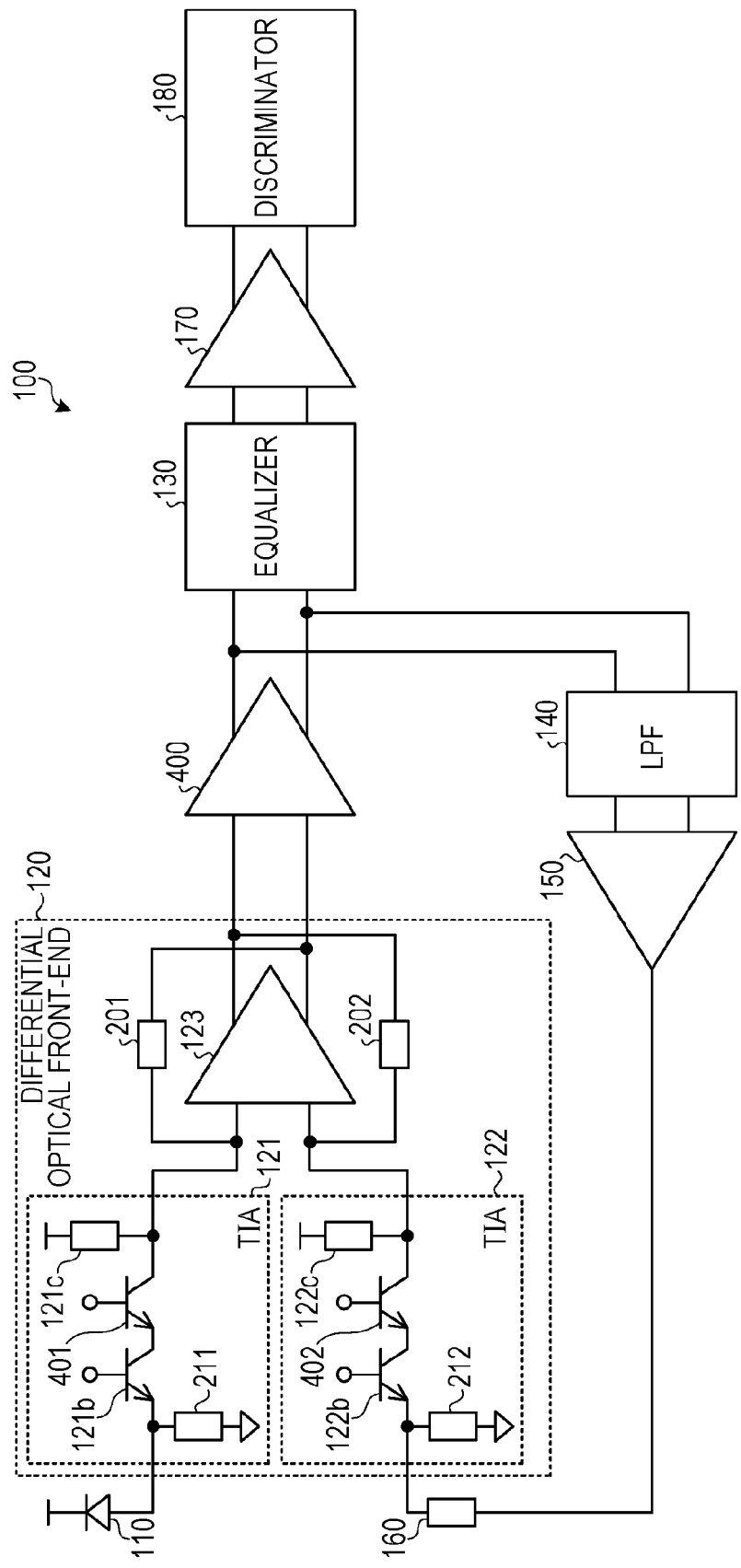
FIG. 4 illustrates an example (a fourth example) of the configuration of an optical receiving circuit.

FIG. 4 illustrates an example (a fourth example) of the configuration of an optical receiving circuit. In FIG. 4, the same reference symbols are used for the same configurations as in FIGS. 1 to 3, and descriptions of the configurations are not repeated. As illustrated in FIG. 4, an optical receiving circuit 100 includes TIAs 121 and 122 having configurations that differ from those in the optical receiving circuit 100 illustrated in FIG. 2. In addition, the optical receiving circuit 100 includes an amplifier circuit 400.

In addition to the bipolar transistor 121b illustrated in FIG. 2, the TIA 121 includes a bipolar transistor 401 connected in series. The collector of the bipolar transistor 121b is connected to the emitter of the bipolar transistor 401. The collector of the bipolar transistor 401 is connected to the load resistor 121c and the output end of the TIA 121. The base of the bipolar transistor 401 is connected to an appropriate bias voltage. One end of the load resistor 121c is connected to a point between the bipolar transistor 401 and the differential amplifier circuit 123.

In addition to the bipolar transistor 122b illustrated in FIG. 2, the TIA 122 includes a bipolar transistor 402 connected in series. The collector of the bipolar transistor 122b is connected to the emitter of the bipolar transistor 402. The collector of the bipolar transistor 402 is connected to the load resistor 122c and the output end of the TIA 122. The base of the bipolar transistor 402 is connected to an appropriate bias voltage. One end of the load resistor 122c is connected to a point between the bipolar transistor 402 and the differential amplifier circuit 123.

The differential amplifier circuit 123 performs differential amplification on the basis of the electrical signal output from the TIA 121 and the electrical signal output from the TIA 122. Thereafter, the differential amplifier circuit 123 outputs a differential electrical signal obtained through the differential amplification to the amplifier circuit 400. The amplifier circuit 400 amplifies the electrical signal output from the differential amplifier circuit 123 and outputs the electrical signal to the equalizer 130 and the LPF 140. It is desirable that the amplifier circuit 400 have a linear input-output characteristic in the range of the amplitude of the input signal.

The equalizer 130 performs equalization on the electrical signal output from the amplifier circuit 400. For example, the equalizer 130 controls the frequency characteristic so that the waveform of the electrical signal output from the amplifier circuit 400 is restored and a variation of the waveform is minimized. Among the electrical signals output from the amplifier circuit 400, the LPF 140 allows a frequency component lower than or equal to the cutoff frequency to pass therethrough to the offset compensation amplifier 150 and blocks a frequency component higher than the cutoff frequency.

Through the configuration illustrated in FIG. 4, even the configuration using the TIA 121 including the bipolar transistors 121b and 401 connected in series and the TIA 122 including the bipolar transistors 122b and 402 connected in series can provide an advantage that is the same as in the configuration illustrated in FIG. 1.

In addition, by providing the amplifier circuit 400, the gain of the optical receiving circuit can be increased and, thus, a smaller electrical signal input to the differential optical front-end 120 can be amplified into a larger electrical signal. In addition, by connecting the bipolar transistor 121b to the bipolar transistor 401 in series and connecting the bipolar transistor 122b to the bipolar transistor 402 in series, different grounded-base transistors can be used for the input and output sides. Thus, the flexibility of the design can be increased. For example, by using a transistor having a small size as the bipolar transistor 401 on the output side, the bandwidth of a grounded-base circuit can be increased.

The number of the amplifier circuit 400 is not limited to one. For example, a plurality of the amplifier circuits 400 may be disposed so as to be connected in series. By using such a configuration, a smaller electrical signal input to the differential optical front-end 120 can be amplified into a larger electrical signal. In addition, even when the installation positions of the amplifier circuit 400 and the equalizer 130 are exchanged, the same advantage can be provided.

Note that in the example illustrated in FIG. 4, the TIAs 121 and 122 of a grounded-base type are employed. However, the TIAs 121 and 122 of a grounded-gate type can be employed. More specifically, an additional FET may be connected in series to the FET 311 illustrated in FIG. 3, and an additional FET may be connected in series to the FET 312. Such a configuration can increase the bandwidth of the grounded-base circuit.

Figure 5:
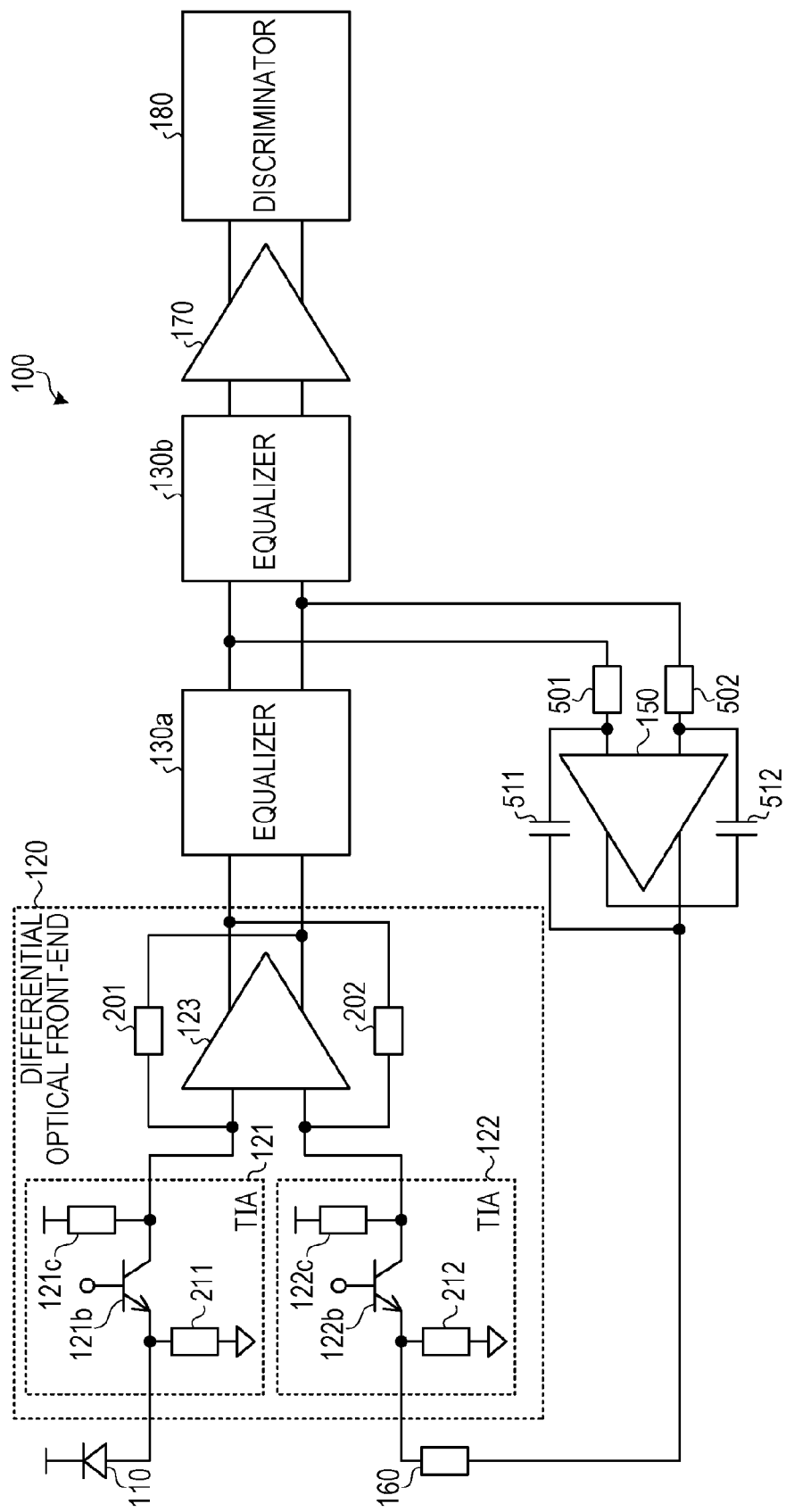
FIG. 5 illustrates an example (a fifth example) of the configuration of an optical receiving circuit.

FIG. 5 illustrates an example (a fifth example) of the configuration of an optical receiving circuit. In FIG. 5, the same reference symbols are used for the same configurations as in FIGS. 1 to 4, and descriptions of the configurations are not repeated. As illustrated in FIG. 5, unlike the optical receiving circuit 100 illustrated in FIG. 2, an optical receiving circuit 100 includes a plurality of the equalizers 130 and does not include the LPF 140. In addition, the optical receiving circuit 100 includes an offset compensation amplifier 150 having a configuration that differs from that in the optical receiving circuit 100 illustrated in FIG. 2.

In FIG. 5, the equalizer 130 in the previous stage is referred to as an "equalizer 130a", and the equalizer 130 in the subsequent stage is referred to as an "equalizer 130b". The equalizer 130a in the previous stage outputs an electrical signal subjected to equalization to the equalizer 130b in the subsequent stage and the offset compensation amplifier 150. The equalizer 130b in the subsequent stage performs equalization on the electrical signal output from the equalizer 130a in the previous stage.

For example, the equalizer 130b in the subsequent stage controls the frequency characteristic so that the waveform of the electrical signal output from the equalizer 130a in the previous stage is restored and a variation of the waveform is minimized. The equalizer 130b in the subsequent stage outputs the electrical signal subjected to equalization to the output buffer circuit 170.

The configuration of the equalizer 130b in the subsequent stage may differ from that of the equalizer 130a in the previous stage. More specifically, each of the equalizer 130a in the previous stage and the equalizer 130b in the subsequent stage may be one of equalizers having the configurations described below.

Resistors 501 and 502 are connected to capacitors 511 and 512, respectively. The resistors 501 and 502 together serve as a lowpass filter. One end of the resistor 501 and one end of the resistor 502 are connected to the equalizers 130a and 130b, respectively. The other end of the resistor 501 and the other end of the resistor 502 are connected to the offset compensation amplifier 150.

For example, one end of the capacitor 511 is connected to the non-inverting input terminal of the offset compensation amplifier 150, and the other end is connected to the inverting input terminal of the offset compensation amplifier 150. In addition, one end of the capacitor 512 is connected to the inverting input terminal of the offset compensation amplifier 150, and the other end is connected to the non-inverting input terminal of the offset compensation amplifier 150. The offset compensation amplifier 150 amplifies the electrical signal output from the equalizer 130a in the previous stage and outputs the electrical signal to the offset compensation resistor 160.

Even the configuration illustrated in FIG. 5 can provide an advantage that is the same as that in the configuration illustrated in FIG. 1. In addition, by using the above-described feedback capacitors 511 and 512, a large equivalent capacitance value can be obtained due to a mirror effect. Thus, a lowpass filter having a low cutoff frequency can be achieved using a small capacitance value. Furthermore, such a configuration is suitable for an integrated circuit that is difficult to provide a large capacitance value.

In addition, by providing the equalizer 130b in the subsequent stage, the frequency characteristic equalization performance can be improved.

Figure 6:
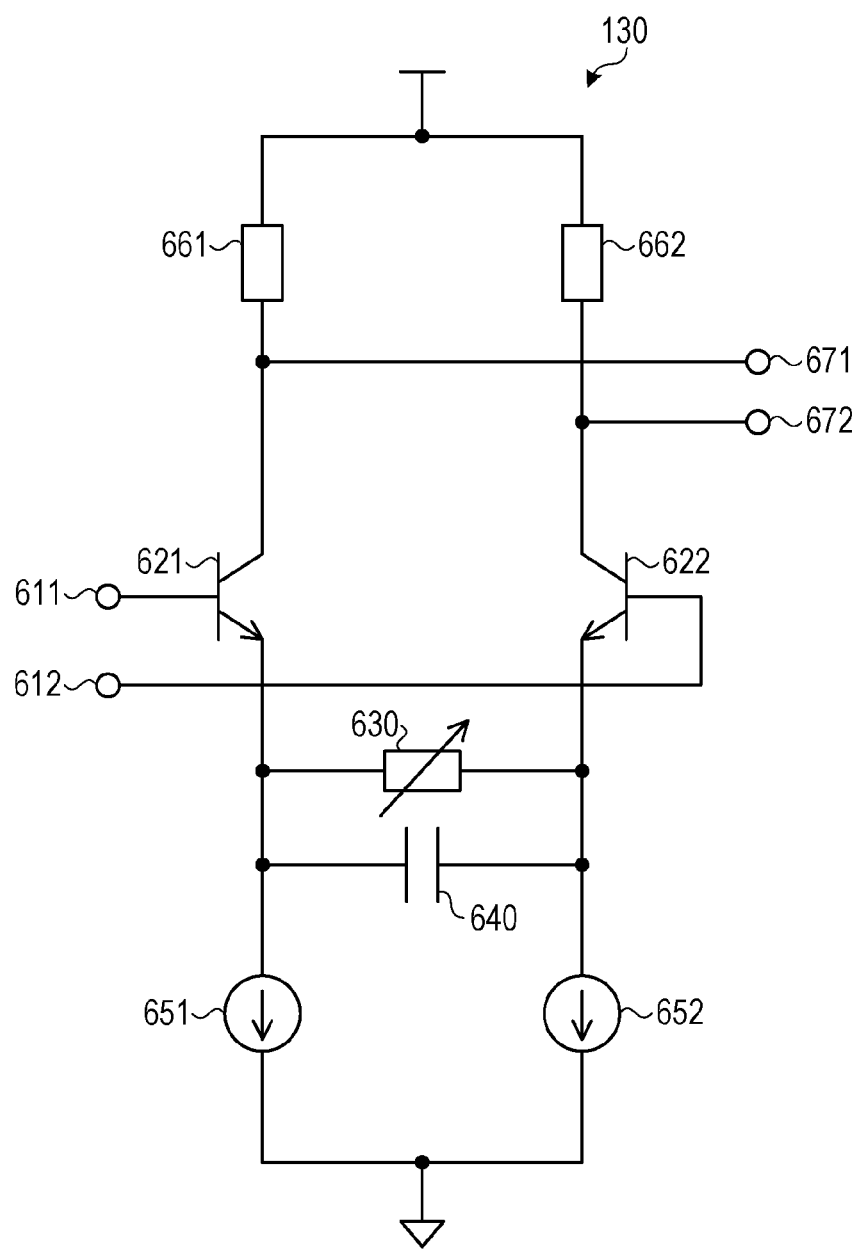
FIG. 6 illustrates an example (a first example) of the configuration of an equalizer circuit.

The circuit configuration of the equalizer 130 is described next. FIG. 6 illustrates an example (a first example) of the configuration of the equalizer circuit. As illustrated in FIG. 6, the equalizer 130 includes input terminals 611 and 612, bipolar transistors 621 and 622, a variable resistor 630, a capacitor 640, current sources 651 and 652, resistors 661 and 662, and output terminals 671 and 672.

The equalizer 130 performs equalization on the differential signal output from the differential optical front-end 120 and outputs the resultant signal to the output buffer circuit 170. The in positive signal output from the differential optical front-end 120 is input to, for example, the input terminal 611. The negative signal output from the differential optical front-end 120 is input to, for example, the input terminal 612.

The base of the bipolar transistor 621 is connected to the input terminal 611. The collector of the bipolar transistor 621 is connected to the resistor 661 and the output terminal 671. The emitter of the bipolar transistor 621 is connected to the variable resistor 630, the capacitor 640, and the current source 651.

The base of the bipolar transistor 622 is connected to the input terminal 612. The collector of the bipolar transistor 622 is connected to the resistor 662 and the output terminal 672. The emitter of the bipolar transistor 622 is connected to the variable resistor 630, the capacitor 640, and the current source 652.

The variable resistor 630 has a variable resistance. One end of the variable resistor 630 is connected to the bipolar transistor 621, the capacitor 640, and the current source 651. The other end is connected to the bipolar transistor 622, the capacitor 640, and the current source 652.

One end of the capacitor 640 is connected to the bipolar transistor 621, the variable resistor 630, and the current source 651. The other end is connected to the bipolar transistor 622, the variable resistor 630, and the current source 652.

One end of the current source 651 is connected to the bipolar transistor 621, the variable resistor 630, and the capacitor 640. The other end is connected to ground. One end of the current source 652 is connected to the bipolar transistor 622, the variable resistor 630, and the capacitor 640. The other end is connected to ground.

One end of the resistor 661 is connected to the bipolar transistor 621 and the output terminal 671. The other end is connected to, for example, a voltage source. One end of the resistor 662 is connected to the bipolar transistor 622 and the output terminal 672. The other end is connected to, for example, a voltage source.

The output terminal 671 is connected to a point between the bipolar transistor 621 and the resistor 661. For example, the output terminal 671 outputs the in positive signal to the LPF 140 and the output buffer circuit 170. The output terminal 672 is connected to a point between the bipolar transistor 622 and the resistor 662. For example, the output terminal 672 outputs the negative signal to the LPF 140 and the output buffer circuit 170.

In the configuration illustrated in FIG. 6, by using the variable resistor 630 and the capacitor 640, the equalizer 130 can have a frequency characteristic with a zero and, thus, have a characteristic in which the gain in the high-frequency region is higher than in the low-frequency region. In addition, equalization can be performed on the electrical signal output from the differential amplifier circuit 123.

Figure 7:
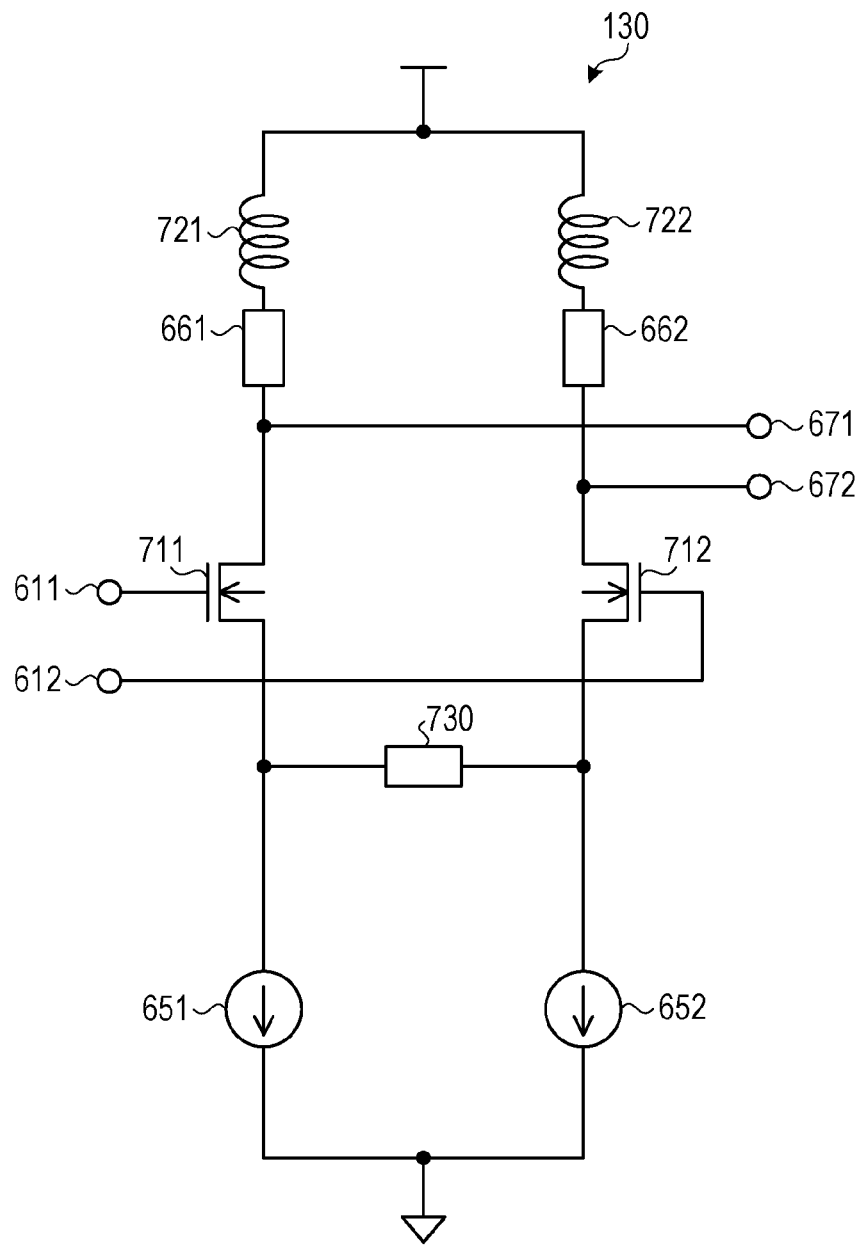
FIG. 7 illustrates an example (a second example) of the configuration of an equalizer circuit.

FIG. 7 illustrates an example (a second example) of the configuration of the equalizer circuit. In FIG. 7, the same reference symbols are used for the same configurations as in FIG. 6, and descriptions of the configurations are not repeated. As illustrated in FIG. 7, the equalizer 130 may include FETs 711 and 712 instead of the bipolar transistors 621 and 622 included in the equalizer 130 illustrated in FIG. 6.

In addition, an inductor 721 may be connected in series between the resistor 661 and the inductor 721. Furthermore, an inductor 722 may be connected in series between the resistor 662 and the voltage source. Still furthermore, instead of the variable resistor 630, a resistor 730 having a fixed resistance value can be provided. Yet still furthermore, the capacitor 640 may be removed.

In the configuration illustrated in FIG. 7, by using the resistors 661 and 662 and the inductors 721 and 722, the equalizer 130 can have a frequency characteristic with a zero and, thus, have a characteristic in which the gain in the high-frequency region is higher than in the low-frequency region. In addition, equalization can be performed on the electrical signal output from the differential amplifier circuit 123.

Figure 8:
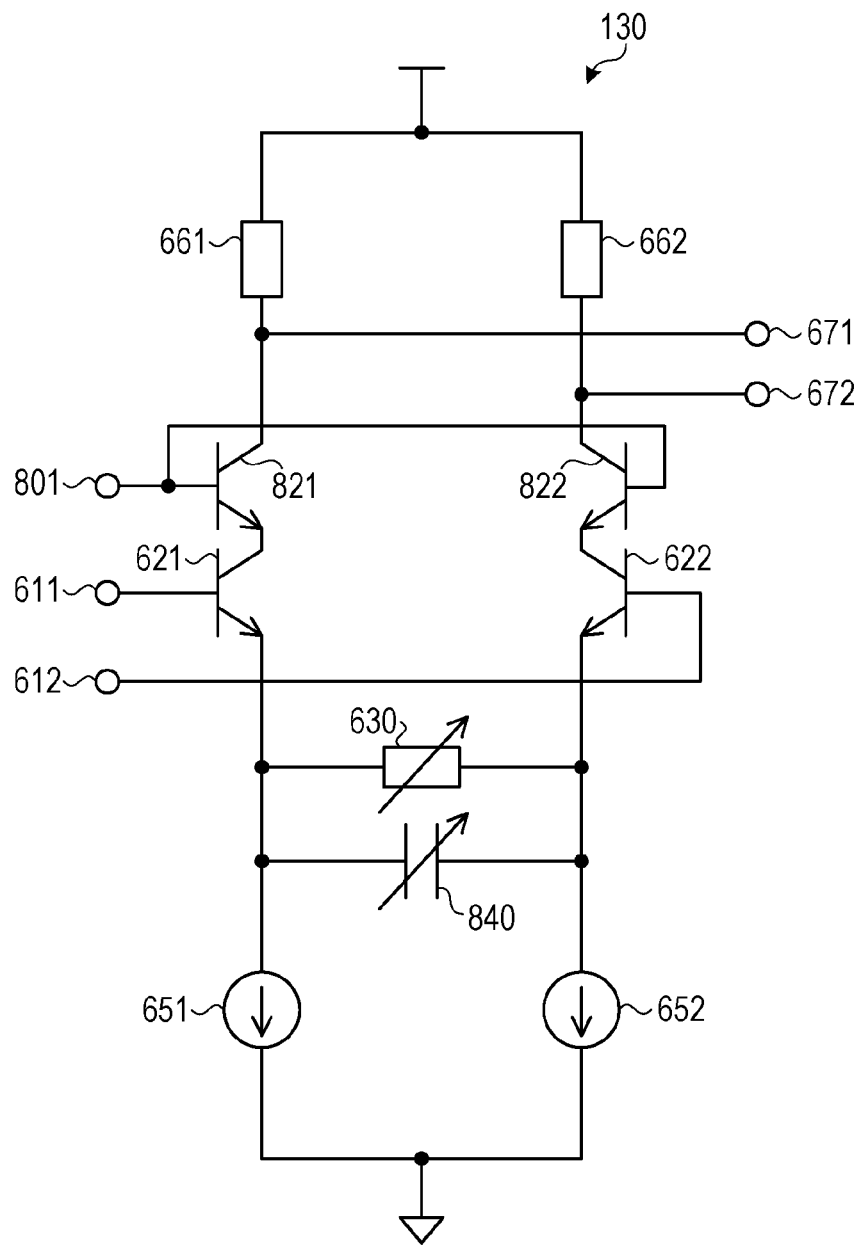
FIG. 8 illustrates an example (a third example) of the configuration of an equalizer circuit.

FIG. 8 illustrates an example (a third example) of the configuration of the equalizer circuit. In FIG. 8, the same reference symbols are used for the same configurations as in FIGS. 6 and 7, and descriptions of the configurations are not repeated. As illustrated in FIG. 8, unlike the equalizer 130 illustrated in FIG. 6, an equalizer 130 may have additional bipolar transistors 821 and 822 operating as a grounded-base circuit and may have a variable capacitor 840 instead of the capacitor 640.

More specifically, the base of the bipolar transistor 821 is connected to a bias 801 that applies a fixed voltage. The collector of the bipolar transistor 821 is connected to the resistor 661 and the output terminal 671. The emitter of the bipolar transistor 821 is connected to the bipolar transistor 621.

The base of the bipolar transistor 822 is connected to the bias 801. The collector of the bipolar transistor 822 is connected to the resistor 662 and the output terminal 672. The emitter of the bipolar transistor 822 is connected to the bipolar transistor 622.

In addition, one end of the variable capacitor 840 is connected to the bipolar transistor 621, the variable resistor 630, and the current source 651. The other end is connected to the bipolar transistor 622, the variable resistor 630, and the current source 652.

In the configuration illustrated in FIG. 8, by inserting a grounded-base circuit, an increase in equivalent parasitic capacitance of a transistor caused by a mirror effect can be reduced and, thus, the bandwidth of the equalizer circuit can be increased.

An optimization principle equation for optimizing the frequency characteristic of the equalizer circuit having zeros and poles is described below. The following equation (1) (hereinafter referred to as "principle equation (1)") represents a transfer function $G(\omega)$. In principle equation (1), $z1, z2, \ldots zn$ represent zeros, and $p1, p2, \ldots pm$ represent poles. The zeros are determined by, for example, the values of the variable resistor 630 and the variable capacitor 840. In addition, the poles are determined by the parasitic capacitance values of the bipolar transistors 621 and 622 and the values of the resistors 661 and 662.

$$G(\omega) = \frac{(j\omega + z1)(j\omega + z2) \ldots (j\omega + zn)}{(j\omega + p1)(j\omega + p2) \ldots (j\omega + pm)} \quad (1)$$

Figure 9:
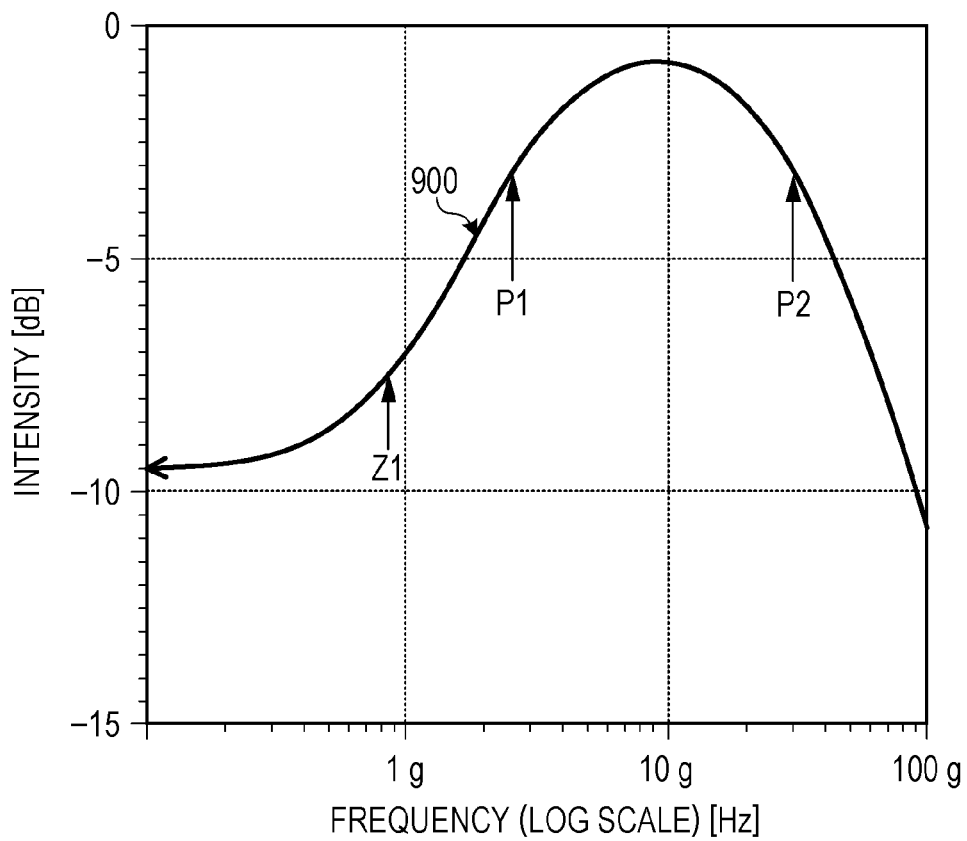
FIG. 9 illustrates an example of the simulation result of principle equation (1)

A simulation result of principle equation (1) is described below with reference to FIG. 9. FIG. 9 illustrates an example of the simulation result of principle equation (1). In FIG. 9, the abscissa represents the logarithmized frequency (Hz), and the ordinate represents the intensity of a signal (dB). A frequency-intensity characteristic curve 900 indicates the intensity with respect to the frequency of a signal in the equalizer 130. Z1 indicates the frequency of the zero of the above-described characteristic, and P1 and P2 indicate the frequencies of the poles of the above-described characteristic.

As illustrated in FIG. 9, let the zero Z1 of the equalizer 130 be a frequency lower than the poles P1 and P2. In this manner, the gain at a high frequency can be made higher than the gain at a low frequency. Thus, an equalization unit can be achieved.

The zero Z1 in the example of the configuration (the first example) of the equalizer 130 can be adjusted by using, for example, the variable resistor 630 and the capacitor 640 illustrated in FIG. 6. In addition, the zero Z1 in the example of the configuration (the second example) of the equalizer 130 can be adjusted by using, for example, the resistor 661 and the inductor 721 illustrated in FIG. 7. Furthermore, the zero Z1 in the example of the configuration (the third example) of the equalizer 130 can be adjusted by using, for example, the variable resistor 630 and the variable capacitor 840 illustrated in FIG. 8.

Figure 10:
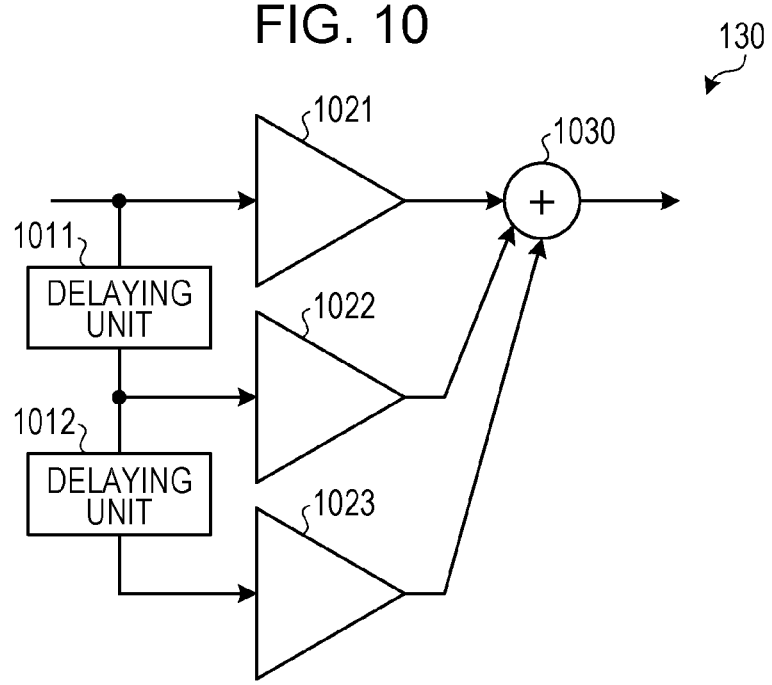
FIG. 10 illustrates an example (a fourth example) of the configuration of an equalizer circuit.

FIG. 10 illustrates an example (a fourth example) of the configuration of the equalizer circuit. As illustrated in FIG. 10, the equalizer 130 includes delaying units 1011 and 1012, amplifiers 1021, 1022, and 1023, and an adder 1030. The equalizer 130 is of feedforward type. The equalizer 130 performs equalization on the differential signal output from the differential optical front-end 120 and outputs the differential signal to the output buffer circuit 170.

The signal output from the differential optical front-end 120 is input to the delaying unit 1011 and the amplifier 1021. The delaying unit 1011 is a delaying circuit that delays the input signal. The delaying unit 1011 outputs the delayed signal to the delaying unit 1012 and the amplifier 1022. The delaying unit 1012 is a delaying circuit that delays the signal input from the delaying unit 1011. The delaying unit 1012 outputs the delayed signal to the amplifier 1023. By using the delaying unit 1011 and the delaying unit 1012, a delaying unit that delays the in positive signal and the negative signal output from the differential amplifier circuit 123 can be achieved.

The amplifier 1021 amplifies the input signal. The amplifier 1021 outputs the amplified signal to the adder 1030 in, for example, positive polarity. The amplifier 1022 amplifies the signal output from the delaying unit 1011. The amplifier 1022 outputs the amplified signal to the adder 1030 in, for example, negative polarity (in the case of subtraction). The amplifier 1023 amplifies the signal output from the delaying unit 1012. The amplifier 1023 outputs the amplified signal to the adder 1030 in, for example, positive polarity. The adder 1030 is an adder circuit that sums the signals output from the amplifiers 1021, 1022, and 1023. The adder 1030 outputs the sum of the signals to the output buffer circuit 170.

Note that the adder 1030 is not limited to an adder circuit. For example, a subtractor circuit that performs subtraction on the signals output from the amplifiers 1021, 1022, and 1023 can be used as the adder 1030. In addition, the number of each of the delaying units 1011 and 1012 and the amplifiers 1021, 1022, and 1023 can be set to any number. For example, if the number of delaying units is set to n (n≥1), the number of amplifiers can be set to n+1. The positions of the amplifies can be determined so that the additional amplifiers have increased amounts of delay as the number increases, as illustrated in FIG. 10. By using the adder 1030, a computing unit that performs addition or subtraction on the signal delayed by the delaying units 1011 and 1012 and the signal output from the differential amplifier circuit 123 can be achieved.

To optimize the frequency characteristic in the equalizer 130 illustrated in FIG. 10, the following principle equation $G(\omega)$ (equation (2)) can be used. In equation (2), T1 represents the amount of delay in the delaying unit 1011, and T2 represents the amount of delay in the delaying unit 1012. A1 represents the gain of the amplifier 1021, A2 represents the gain of the amplifier 1022, and A3 represents the gain of the amplifier 1023.

$$G(\omega) = A1 + A2e^{-j\omega*T1} + A3e^{-j\omega*(T1+T2)} \quad (2)$$

Figure 11:
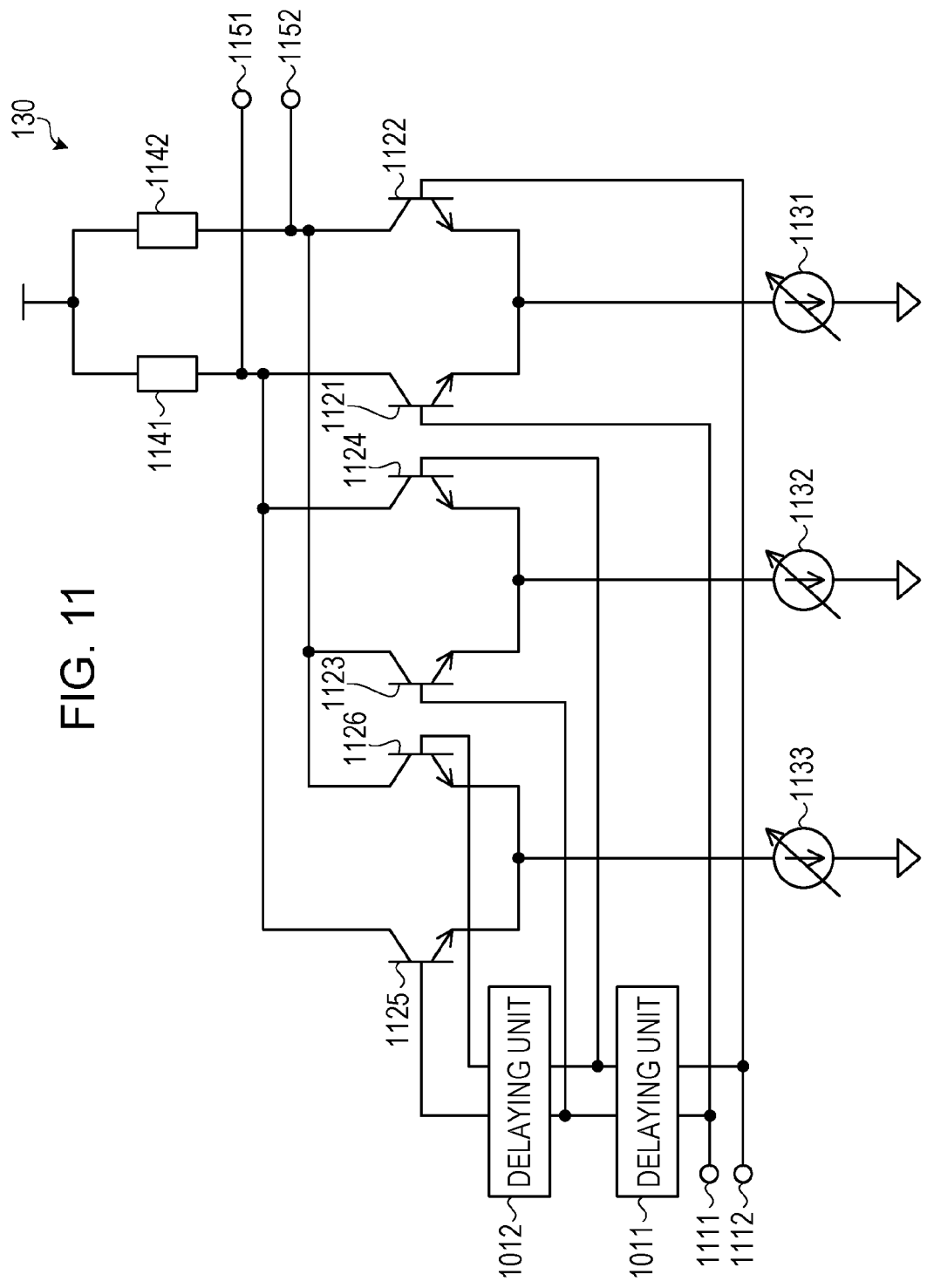
FIG. 11 illustrates an example of the equalizer circuit illustrated in FIG. 10.

FIG. 11 illustrates an example of the equalizer circuit illustrated in FIG. 10. As illustrated in FIG. 11, the equalizer 130 includes the delaying units 1011 and 1012, input terminals 1111 and 1112, bipolar transistors 1121 to 1126, load resistors 1141 and 1142, and output terminals 1151 and 1152.

The in positive signal output from the differential optical front-end 120 is input to the input terminal 1111. The negative signal output from the differential optical front-end 120 is input to the input terminal 1112.

The base of the bipolar transistor 1121 is connected to the input terminal 1111. The collector of the bipolar transistor 1121 is connected to the bipolar transistor 1124, the bipolar transistor 1125, the load resistor 1141, and the output terminal 1151. The emitter of the bipolar transistor 1121 is connected to a variable current source 1131 and the bipolar transistor 1122.

The base of the bipolar transistor 1122 is connected to the input terminal 1112. The collector of the bipolar transistor 1122 is connected to the bipolar transistor 1123, the bipolar transistor 1126, the load resistor 1142, and the output terminal 1152. The emitter of the bipolar transistor 1122 is connected to the variable current source 1131 and the bipolar transistor 1121. The bipolar transistors 1121 and 1122, the load resistors 1141 and 1142, and the variable current source 1131 together form a first amplifier (corresponding to the amplifier 1021 illustrated in FIG. 10).

The delaying unit 1011 delays the signal input from each of the input terminals 1111 and 1112. The delaying unit 1011 outputs the delayed signal to the delaying unit 1012, the bipolar transistor 1123, and the bipolar transistor 1124.

The base of the bipolar transistor 1123 is connected to the delaying unit 1011. The collector of the bipolar transistor 1123 is connected to the bipolar transistor 1122, the bipolar transistor 1126, the load resistor 1142, and the output terminal 1152. The emitter of the bipolar transistor 1123 is connected to a variable current source 1132 and the bipolar transistor 1124.

The base of the bipolar transistor 1124 is connected to the delaying unit 1011. The collector of the bipolar transistor 1124 is connected to the bipolar transistor 1121, the bipolar transistor 1125, the load resistor 1141, and the output terminal 1151. The emitter of the bipolar transistor 1124 is connected to the variable current source 1132 and the bipolar transistor 1123. The bipolar transistors 1123 and 1124, the load resistors 1141 and 1142, and the variable current source 1132 together form a second amplifier (corresponding to the amplifier 1022 illustrated in FIG. 10).

The delaying unit 1012 delays the signal output from the delaying unit 1011. The delaying unit 1012 outputs the delayed signal to the bipolar transistor 1125 and the bipolar transistor 1126.

The base of the bipolar transistor 1125 is connected to the delaying unit 1012. The collector of the bipolar transistor 1125 is connected to the bipolar transistor 1121, the bipolar transistor 1124, the load resistor 1141, and the output terminal 1151. The emitter of the bipolar transistor 1125 is connected to a variable current source 1133 and the bipolar transistor 1126.

The base of the bipolar transistor 1126 is connected to the delaying unit 1012. The collector of the bipolar transistor 1126 is connected to the bipolar transistor 1122, the bipolar transistor 1123, the load resistor 1142, and the output terminal 1152. The emitter of the bipolar transistor 1126 is connected to the variable current source 1133 and the bipolar transistor 1125. The bipolar transistors 1125 and 1126, the load resistors 1141 and 1142, and the variable current source 1133 together form a third amplifier (corresponding to the amplifier 1023 illustrated in FIG. 10). By connecting each of the amplifiers to the common load resistors 1141 and 1142, the adder function (the subtraction function for the second amplifier since the second amplifier is connected in negative) can be provided.

Through the configuration illustrated in FIGS. 10 and 11, the equalizer 130 can serve as a feedforward equalizer circuit having a higher gain in the high-frequency region than in the low-frequency region. In addition, the equalizer 130 can perform equalization on the electrical signal output from the differential amplifier circuit 123.

Figure 12:
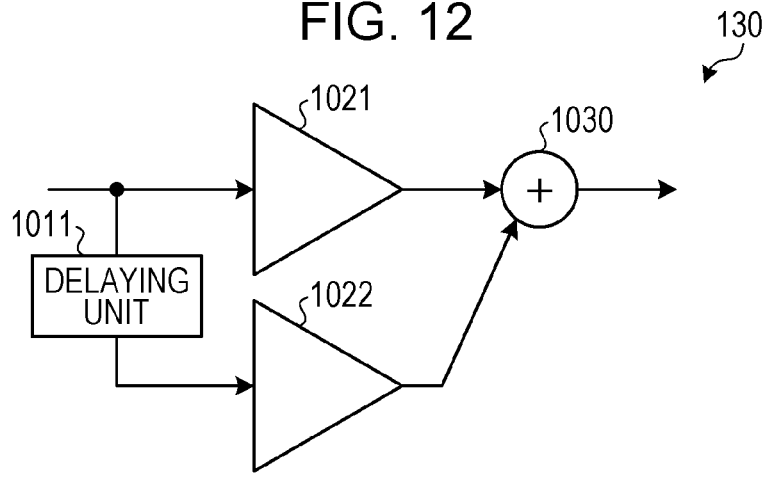
FIG. 12 illustrates an example of the configuration of a feedforward equalizer circuit using a single delaying unit.

FIG. 12 illustrates an example of the configuration of a feedforward equalizer circuit using a single delaying unit. An equalizer 130 illustrated in FIG. 12 is formed by removing the delaying unit 1012 and the amplifier 1023 from the equalizer 130 illustrated in FIG. 10. In FIG. 12, the same reference symbols are used for the same configurations as in FIG. 10, and descriptions of the configurations are not repeated.

As illustrated in FIG. 12, the equalizer 130 includes the delaying unit 1011, the amplifiers 1021 and 1022, and the adder 1030. The delaying unit 1011 delays the input signal and outputs the delayed signal to the amplifier 1022. The amplifier 1021 outputs the amplified signal to the adder 1030 in, for example, positive polarity.

The amplifier 1022 amplifies the signal output from the delaying unit 1011 and outputs the amplified signal to the adder 1030. The amplifier 1022 outputs the amplified signal to the adder 1030 in, for example, reversed polarity. The adder 1030 sums the signals output from the amplifier 1021 and the amplifier 1022. The adder 1030 outputs the sum of the signals to the output buffer circuit 170.

To optimize the frequency characteristic in the equalizer 130 illustrated in FIG. 12, the following principle equation $G(\omega)$ (equation (3)) can be used. In equation (3), T1 represents the amount of delay in the delaying unit 1011. A1 represents the gain of the amplifier 1021, and A2 represents the gain of the amplifier 1022.

$$G(\omega) = A1 + A2 e^{-j\omega \ast T1} \quad (3)$$

Figure 13:
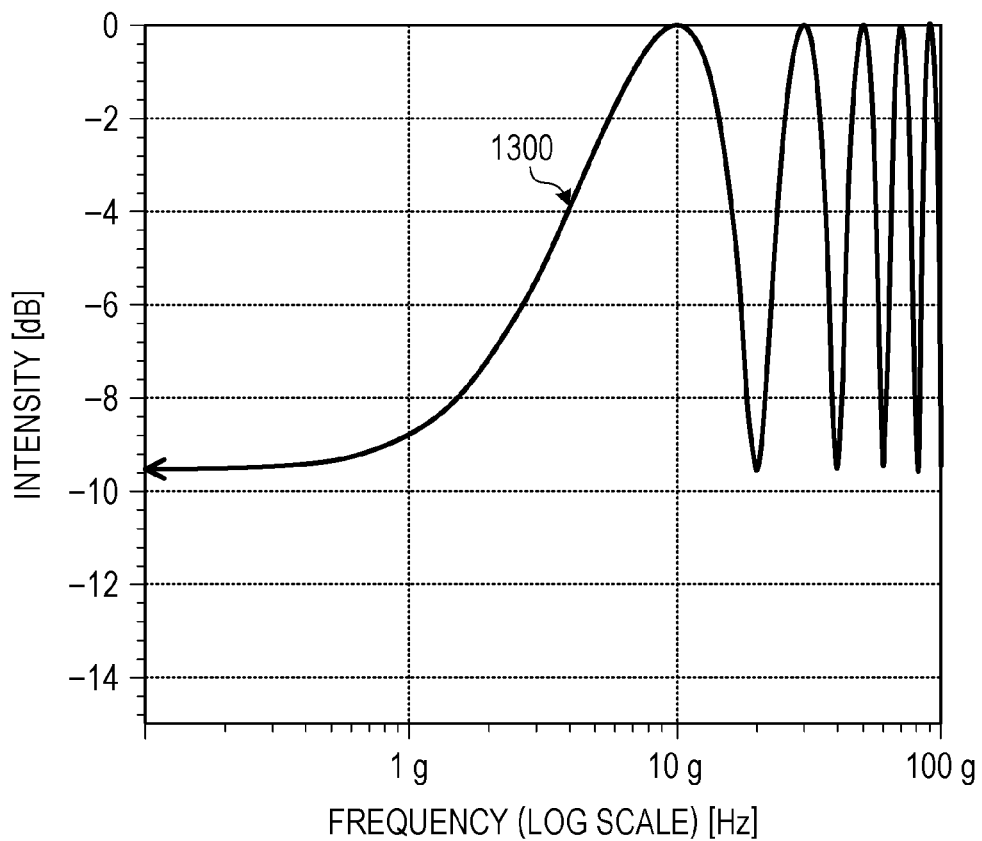
FIG. 13 illustrates an example of a simulation result of principle equation (3)

FIG. 13 illustrates an example of the simulation result of principle equation (3). In FIG. 13, the abscissa represents the logarithmized frequency (Hz), and the ordinate represents the intensity of a signal (dB). FIG. 13 illustrates a result of simulation of a signal of the equalizer 130 illustrated in FIG. 12. A frequency-intensity characteristic curve 1300 indicates the signal intensity with respect to the frequency of the signal in the equalizer 130 on the basis of equation (3).

The frequency-intensity characteristic curve 1300 is a cosine curve. The equalizer 130 uses part of the cosine curve that is convex upward. The frequency increased in the frequency-intensity characteristic curve 1300 can be controlled by the delay time of the delaying unit 1011. Similarly, in the configuration illustrated in FIG. 10, the frequency increased in the frequency-intensity characteristic curve 1300 can be controlled by the delay time of the delaying unit 1011 and the delay time of the delaying unit 1012.

Figure 14:
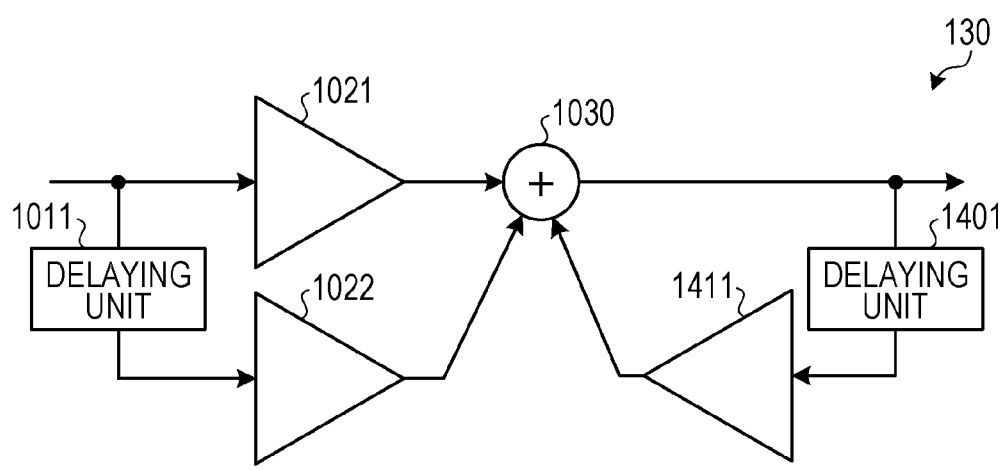
FIG. 14 illustrates an example (a fifth example) of the configuration of an equalizer circuit.

FIG. 14 illustrates an example (a fifth example) of the configuration of the equalizer circuit. The equalizer 130 illustrated in FIG. 14 is formed by additionally providing a delaying unit 1401 and an amplifier 1411 in the equalizer 130 illustrated in FIG. 12. In FIG. 14, the same reference symbols are used for the same configurations as in FIG. 12, and descriptions of the configurations are not repeated. The equalizer 130 illustrated in FIG. 14 is a combination of a feedforward equalizer and a feedback equalizer that feeds back a delayed signal to an adder circuit.

The adder 1030 sums the signals output from the amplifiers 1021, 1022, and 1411. Thereafter, the adder 1030 outputs the sum of the signals to the output buffer circuit 170 and the delaying unit 1401. The delaying unit 1401 delays the signal output from the adder 1030 and outputs the signal to the amplifier 1411. The amplifier 1411 outputs the signal output from the delaying unit 1401 to the adder 1030. By using the adder 1030, a computing unit that can add (or subtract) the signal delayed by the delaying unit 1401 to (from) the signal output from the differential amplifier circuit 123 and input the added or subtracted signal to the delaying unit 1401 can be achieved.

Figure 15:
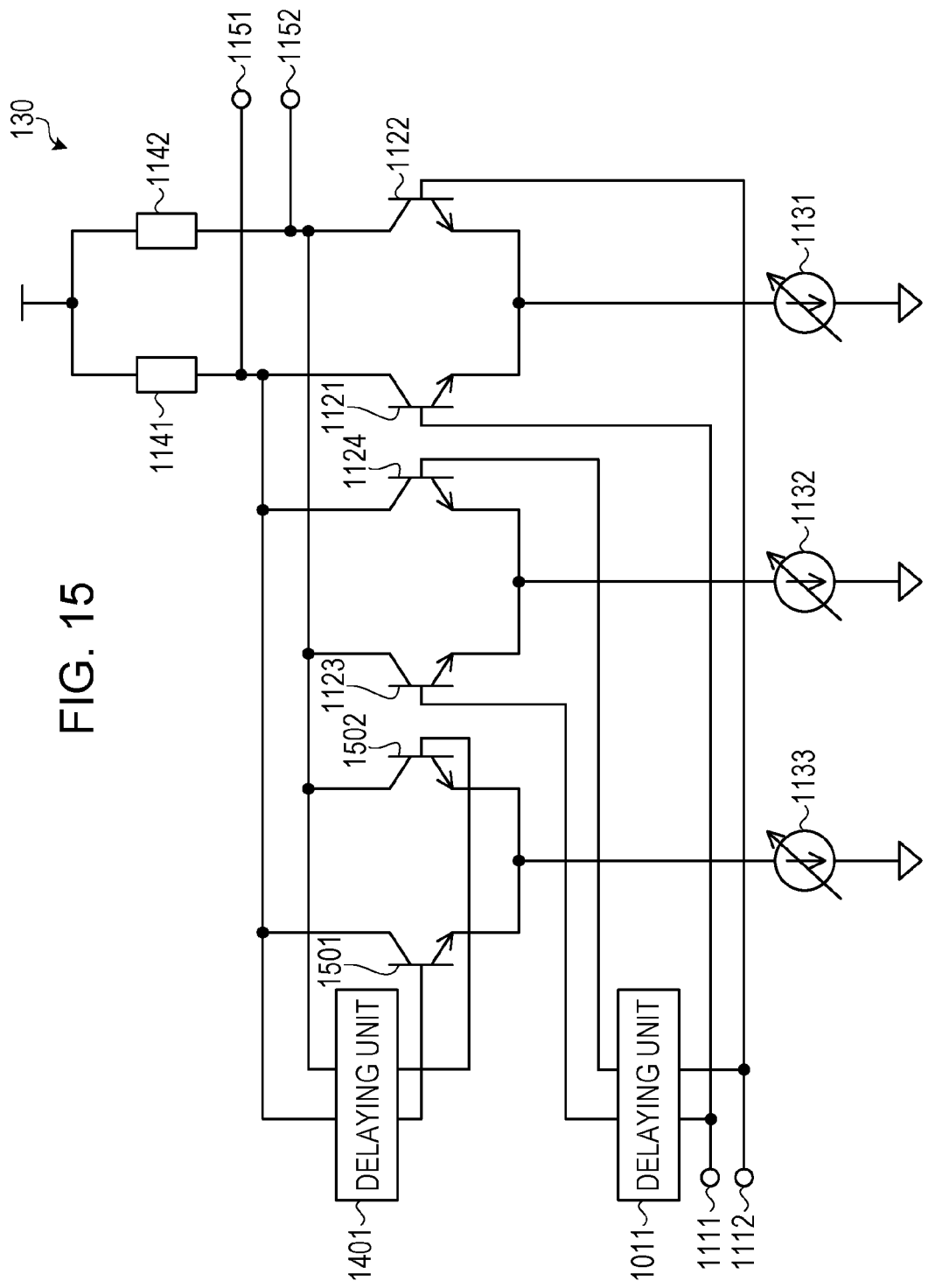
FIG. 15 illustrates an example of the equalizer circuit illustrated in FIG. 14.

FIG. 15 illustrates an example of the equalizer circuit illustrated in FIG. 14. In FIG. 15, the same reference symbols are used for the same configurations as in FIG. 11, and descriptions of the configurations are not repeated. As illustrated in FIG. 15, the equalizer 130 includes the delaying units 1011 and 1401, the input terminals 1111 and 1112, the bipolar transistors 1121 to 1124, bipolar transistors 1501 and 1502, the load resistors 1141 and 1142, and the and output terminals 1151 and 1152.

The collector of the bipolar transistor 1121 is connected to the bipolar transistor 1124, the bipolar transistor 1501, the delaying unit 1401, the load resistor 1141, and the output terminal 1151.

The collector of the bipolar transistor 1122 is connected to the bipolar transistor 1123, the bipolar transistor 1502, the delaying unit 1401, the load resistor 1142, and the output terminal 1152. The bipolar transistors 1121 and 1122, the load resistors 1141 and 1142, and the variable current source 1131 together form a first amplifier (corresponding to the amplifier 1021 in FIG. 14).

The delaying unit 1011 outputs a delayed signal to the bipolar transistor 1123 and the bipolar transistor 1124. The delaying unit 1401 outputs a delayed signal to the bipolar transistor 1501 and the bipolar transistor 1502.

The collector of the bipolar transistor 1123 is connected to the bipolar transistor 1122, the bipolar transistor 1502, the delaying unit 1401, the load resistor 1142, and the output terminal 1152. The bipolar transistors 1123 and 1124, the load resistors 1141 and 1142, and the variable current source 1132 together form a second amplifier (corresponding to the amplifier 1022 in FIG. 14).

The collector of the bipolar transistor 1124 is connected to the bipolar transistor 1121, the bipolar transistor 1501, the load resistor 1141, and the output terminal 1151.

The base of the bipolar transistor 1501 is connected to the delaying unit 1401. The collector of the bipolar transistor 1501 is connected to the delaying unit 1401, the bipolar transistor 1121, the bipolar transistor 1124, the load resistor 1141, and the output terminal 1151. The emitter of the bipolar transistor 1501 is connected to the variable current source 1133 and the bipolar transistor 1502.

The base of the bipolar transistor 1502 is connected to the delaying unit 1401. The collector of the bipolar transistor 1502 is connected to the delaying unit 1401, the bipolar transistor 1122, the bipolar transistor 1123, the load resistor 1142, and the output terminal 1152. The emitter of the bipolar transistor 1502 is connected to the variable current source 1133 and the bipolar transistor 1501. The bipolar transistors 1501 and 1502, the load resistors 1141 and 1142, and the variable current source 1133 together form a third amplifier (corresponding to the amplifier 1411 in FIG. 14). By connecting each of the amplifiers to the common load resistors 1141 and 1142, the adder function (the subtraction function for the second amplifier since the second amplifier is connected in negative) can be provided.

Through the configuration illustrated in FIGS. 14 and 15, the equalizer 130 can serve as a feedforward and feedback equalizer. In addition, the equalizer 130 can perform equalization on the electrical signal output from the differential amplifier circuit 123.

Figure 16:
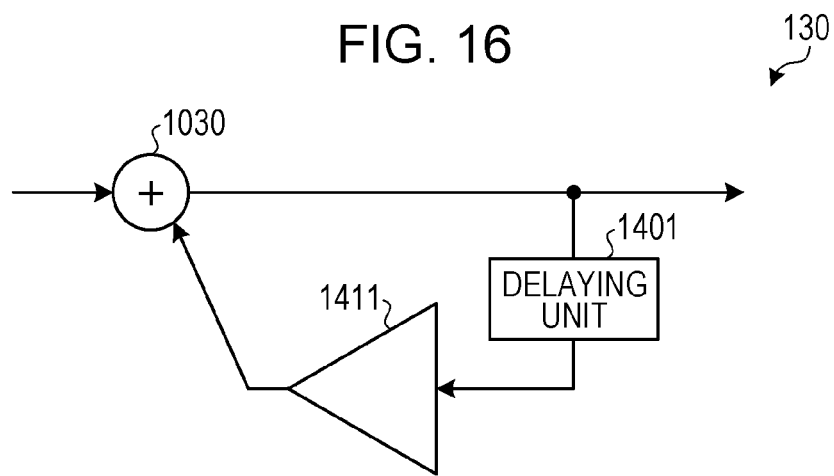
FIG. 16 illustrates an example of the configuration of a feedback equalizer circuit using a single delaying unit.

FIG. 16 illustrates an example of the configuration of a feedback equalizer circuit using a single delaying unit. An equalizer 130 illustrated in FIG. 16 is formed by removing the delaying unit 1011, the amplifier 1021, and the amplifier 1022, which form a feedforward equalizer, from the equalizer 130 illustrated in FIG. 14. In FIG. 16, the same reference symbols are used for the same configurations as in FIG. 14, and descriptions of the configurations are not repeated.

As illustrated in FIG. 16, the equalizer 130 includes the delaying unit 1401, the amplifier 1411, and the adder 1030. The equalizer 130 performs equalization on the differential signal output from the differential optical front-end 120 and outputs the signal to the output buffer circuit 170.

The signal output from the differential optical front-end 120 is input to the adder 1030. The adder 1030 performs addition using the input signal and outputs the resultant signal to the delaying unit 1401. The delaying unit 1401 delays the signal output from the adder 1030 and outputs the delayed signal to the amplifier 1411. The amplifier 1411 amplifies the signal output from the delaying unit 1401 and outputs the amplified signal to the adder 1030.

The adder 1030 sums the signal output from the amplifier 1411 and the signal output from the differential optical front-end 120. Note that for example, the adder 1030 may subtract the signal output from the amplifier 1411 from the signal output from the differential optical front-end 120. In addition, each of the number of the delaying units 1401 and the number of the amplifiers 1411 is not limited to one. A plurality of the delaying units 1401 and a plurality of the amplifiers 1411 may be employed.

To optimize the frequency characteristic in the equalizer 130 illustrated in FIG. 16, the following principle equation G(w) (equation (4)) can be used. In equation (4), TB1 represents the amount of delay in the delaying unit 1401. Note that if a second delaying unit that generates a delayed signal for feedback is provided in addition to the delaying unit 1401, TB2 represents the amount of delay in the second delaying unit. B1 represents the gain of the amplifier 1411. If a second amplifier that is connected to the second delaying unit and that outputs a delayed signal for feedback to the adder 1030 is provided in addition to the amplifier 1411, B2 represents the gain of the second amplifier.

$$G(\omega) = \frac{1}{1 - B1 e^{-j\omega*TB1} - B2 e^{-j\omega*(TB1+TB2)}} \quad (4)$$

Figure 17:
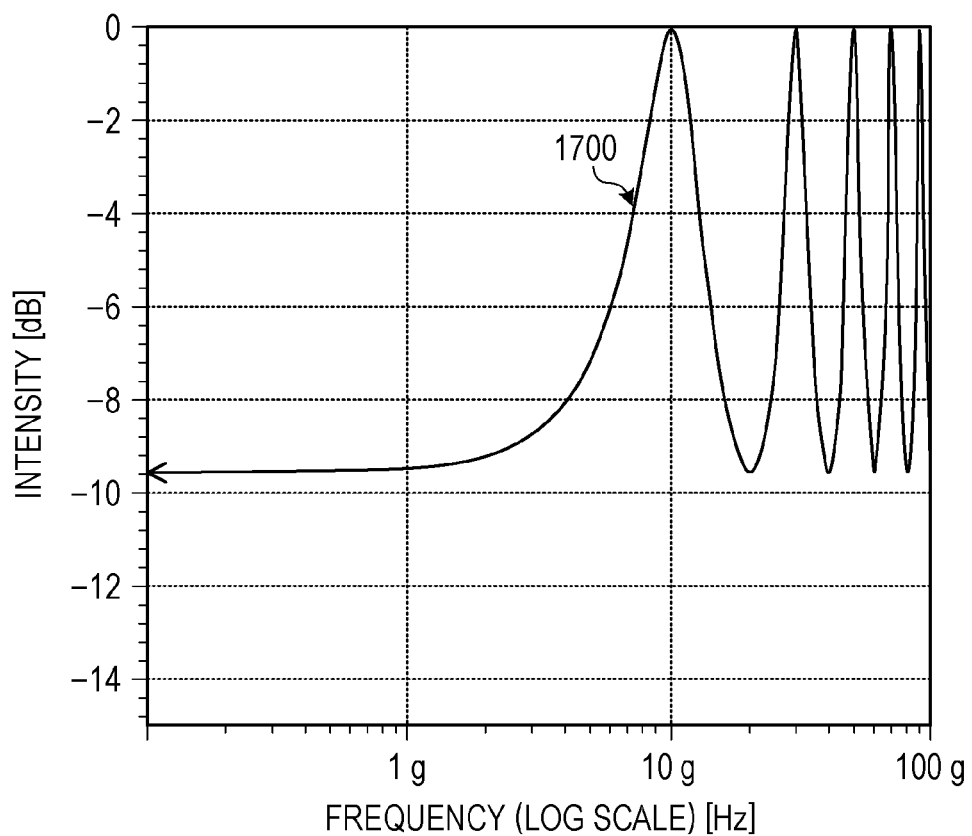
FIG. 17 illustrates an example of the simulation result of principle equation (4)

FIG. 17 illustrates an example of the simulation result of principle equation (4). In FIG. 17, the abscissa represents the logarithmized frequency (Hz), and the ordinate represents the intensity of a signal (dB). A frequency-intensity characteristic curve 1700 indicates the signal intensity characteristic with respect to the frequency of the signal in the equalizer 130. The frequency increased in the frequency-intensity characteristic curve 1700 can be controlled by the delay time of the delaying unit 1401. Similarly, in the configuration illustrated in FIG. 14, the frequency increased in the frequency-intensity characteristic curve 1700 can be controlled by the delay time of the delaying unit 1011 and the delay time of the delaying unit 1401.

The frequency-intensity characteristic curve 1700 of such a feedback equalizer 130 is steeper than that of the signal simulation result of the feedforward equalizer 130 (refer to FIG. 13).

Figure 18:
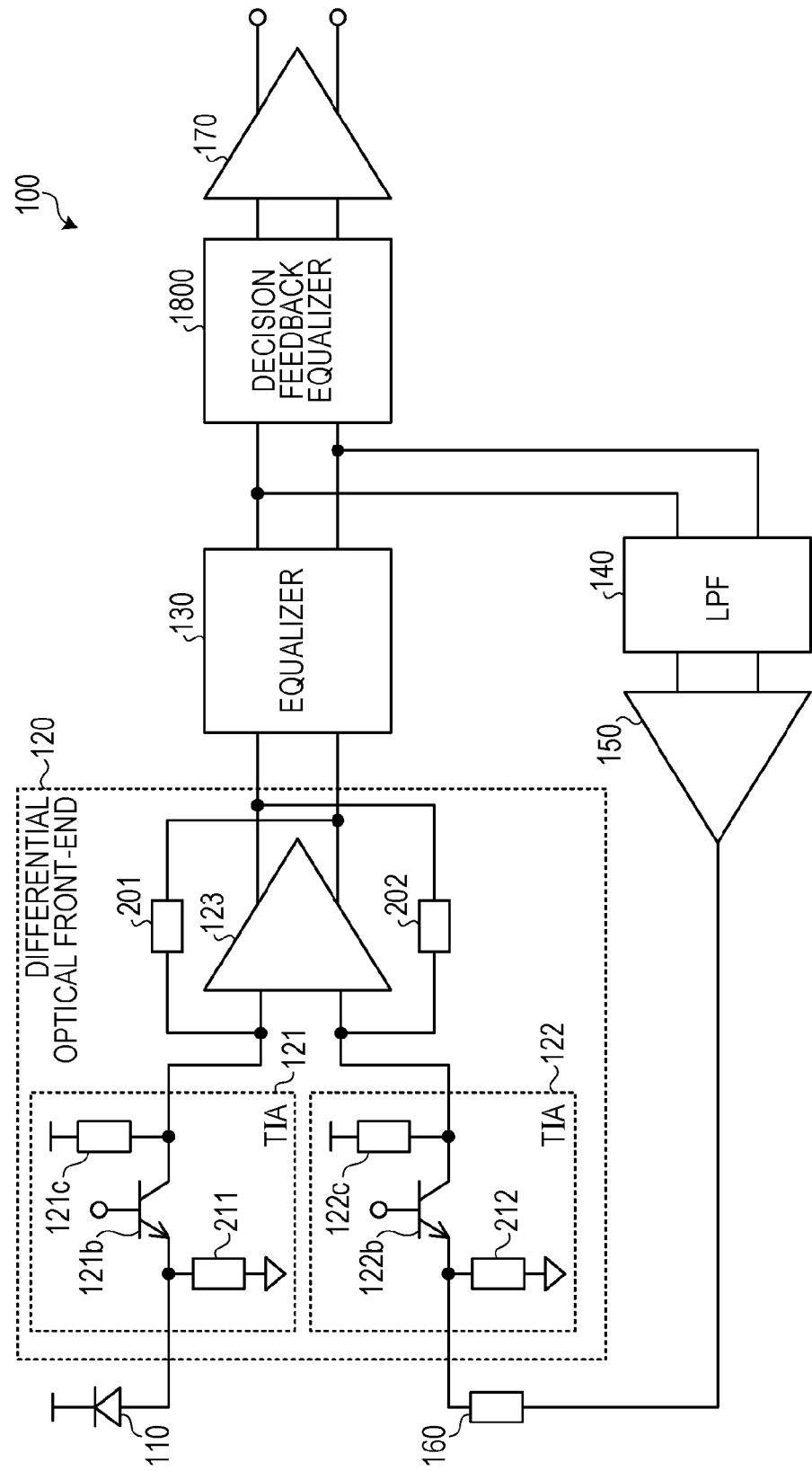
FIG. 18 illustrates an example of the configuration of an optical receiving circuit according to a second exemplary embodiment.

FIG. 18 illustrates an example of the configuration of an optical receiving circuit according to a second exemplary embodiment. In the following description, the same reference symbols are used for the same configurations as in the first exemplary embodiment, and descriptions of the configurations are not repeated. As illustrated in FIG. 18, an optical receiving circuit 100 differs from the optical receiving circuit 100 illustrated in FIG. 2 in that a decision feedback equalizer 1800 is additionally provided and the discriminator 180 is not included.

As illustrated in FIG. 18, the equalizer 130 outputs an electrical signal subjected to equalization to the decision feedback equalizer 1800 and the LPF 140. The decision feedback equalizer 1800 has the function of the discriminator 180 (refer to FIG. 2) and outputs a signal of "0" or "1" to the output buffer circuit 170 on the basis of the signal output from the equalizer 130.

The output buffer circuit 170 outputs the electrical signal output from the decision feedback equalizer 1800 to a circuit (e.g., a demodulator, not illustrated) downstream of the output buffer circuit 170. The output buffer circuit 170 provides impedance matching to a transmission line of the electrical signal output to the demodulator. Through such a configuration, the decision feedback equalizer 1800 can have the function of the discriminator 180 illustrated in FIG. 1.

Figure 19:
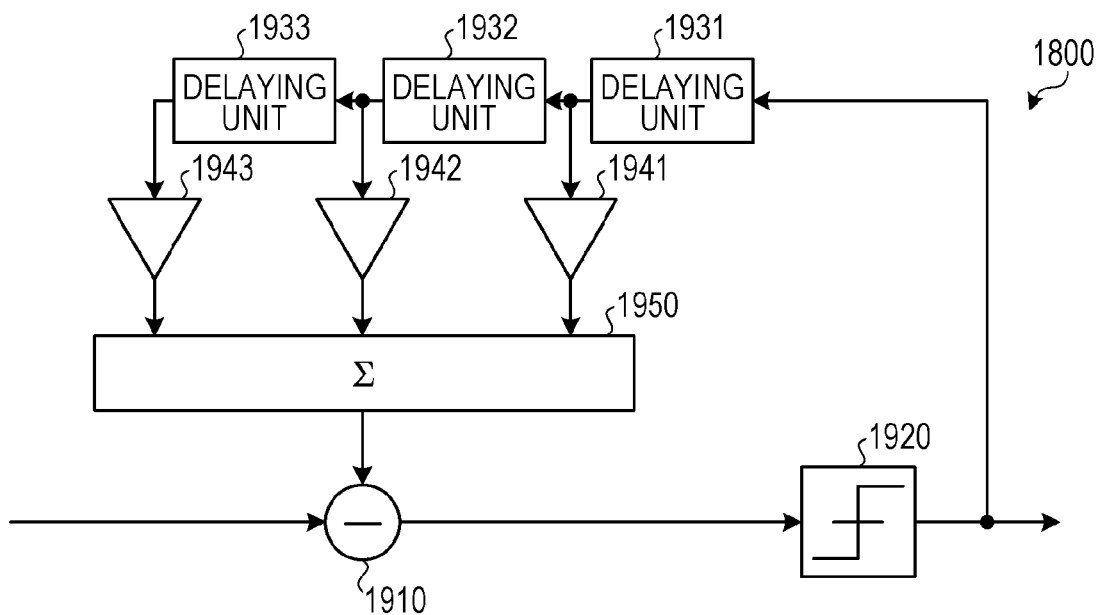
FIG. 19 illustrates an example of a decision feedback equalizer circuit.

FIG. 19 illustrates an example of a decision feedback equalizer circuit. As illustrated in FIG. 19, a decision feedback equalizer 1800 includes a subtractor unit 1910, a determination unit 1920, delaying units 1931, 1932, and 1933, amplifiers 1941, 1942, and 1943, and an adder unit 1950. Note that each of the number of the delaying units (the delaying units 1931, 1932, and 1933) and the number of the amplifiers (the amplifiers 1941, 1942, and 1943) are not limited to three. Any number may be employed.

The subtractor unit 1910 performs subtraction using the signal output from the equalizer 130 and a threshold value output from the adder unit 1950. The subtractor unit 1910 outputs a signal indicating the result of subtraction to the determination unit 1920. Thus, the subtractor unit 1910 can serve as a comparator that compares the signal output from the differential amplifier circuit 123 with the threshold value.

For example, the determination unit 1920 determines whether the received signal is "0" or "1" by determining whether the signal output from the subtractor unit 1910 is positive or negative. Thereafter, the determination unit 1920 outputs a signal indicating the result of determination to the delaying unit 1931. In addition, the result of determination made by the determination unit 1920 is output as a result of discrimination of the received signal. Thus, the determination unit 1920 can serve as a determination unit that determines the data indicated by the optical signal on the basis of the result of comparison performed by the subtractor unit 1910.

The delaying unit 1931 delays the signal output from the determination unit 1920 and outputs the delayed signal to the delaying unit 1932 and the amplifier 1941. The delaying unit 1931 delays the signal output from the determination unit 1920 by, for example, 1 bit. The amplifier 1941 outputs, to the adder unit 1950, a signal having a gain attenuated from a predetermined gain by a certain percent in accordance with the signal output from the delaying unit 1931.

The delaying unit 1932 delays the signal output from the delaying unit 1931 and outputs the delayed signal to the delaying unit 1933 and the amplifier 1942. The delaying unit 1932 delays the signal output from the delaying unit 1931 by, for example, 1 bit. The amplifier 1942 outputs, to the adder unit 1950, a signal having a gain attenuated from a predetermined gain by a certain percent in accordance with the signal output from the delaying unit 1932.

The delaying unit 1933 delays the signal output from the delaying unit 1932 and outputs the delayed signal to the amplifier 1943. The delaying unit 1933 delays the signal output from the delaying unit 1932 by, for example, 1 bit. The amplifier 1943 outputs, to the adder unit 1950, a signal having a gain attenuated from a predetermined gain by a certain percent in accordance with the signal output from the delaying unit 1933.

The delaying units 1931, 1932, and 1933 together can serve as a delaying unit that delays the signal indicating the result of determination made by the determination unit 1920. In addition, the amplifiers 1941, 1942, and 1943 together can serve as an adjustment unit that adjusts the threshold value for the subtractor unit 1910 in accordance with the signal delayed by the delaying units 1931, 1932, and 1933.

The adder unit 1950 outputs, to the subtractor unit 1910, a threshold value obtained by summing the signal output from the delaying unit 1931, the signal output from the delaying unit 1932, and the signal output from the delaying unit 1933. In this manner, the subtractor unit 1910 can perform subtraction using the signal output from the equalizer 130 and the threshold value output from the adder unit 1950.

Note that by using the LPF 140, the offset compensation amplifier 150, and the offset compensation resistor 160 illustrated in FIG. 18, the offset compensation unit can be achieved. The offset compensation unit inputs, to the TIA 122, an offset current signal based on the in positive signal and the negative signal output from the differential amplifier circuit 123 before they are input to the decision feedback equalizer 1800.

Figure 20:
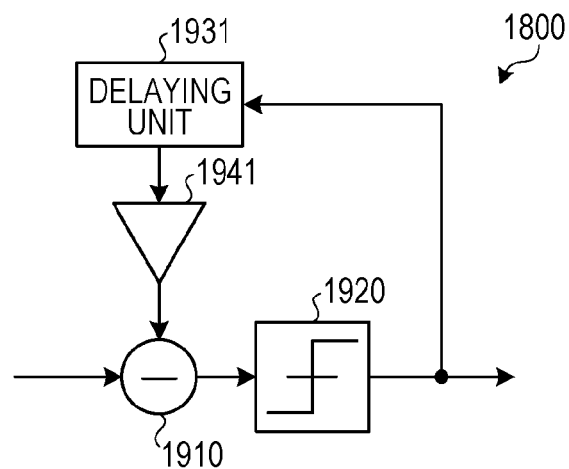
FIG. 20 illustrates an example of the configuration of a decision feedback equalizer circuit including a single delaying unit.

FIG. 20 illustrates an example of the configuration of a decision feedback equalizer circuit including a single delaying unit. The decision feedback equalizer 1800 illustrated in FIG. 20 is formed by removing the delaying unit 1932, the delaying unit 1933, the amplifier 1942, the amplifier 1943, and the adder unit 1950 from the decision feedback equalizer 1800 illustrated in FIG. 19. In FIG. 20, the same reference symbols are used for the same configurations as in FIG. 19, and descriptions of the configurations are not repeated.

As illustrated in FIG. 20, the decision feedback equalizer 1800 includes the subtractor unit 1910, the determination unit 1920, the delaying unit 1931, and the amplifier 1941. The subtractor unit 1910 performs subtraction using a signal output from the equalizer 130 and a threshold value output from the amplifier 1941.

The delaying unit 1931 delays a signal output from the determination unit 1920 and outputs the delayed signal to the amplifier 1941. The amplifier 1941 outputs, to the subtractor unit 1910, a threshold value attenuated from a predetermined gain by a certain percent in accordance with the signal output from the delaying unit 1931. In this manner, the subtractor unit 1910 can perform subtraction using the signal output from the equalizer 130 and the threshold value output from the amplifier 1941.

Figure 21:
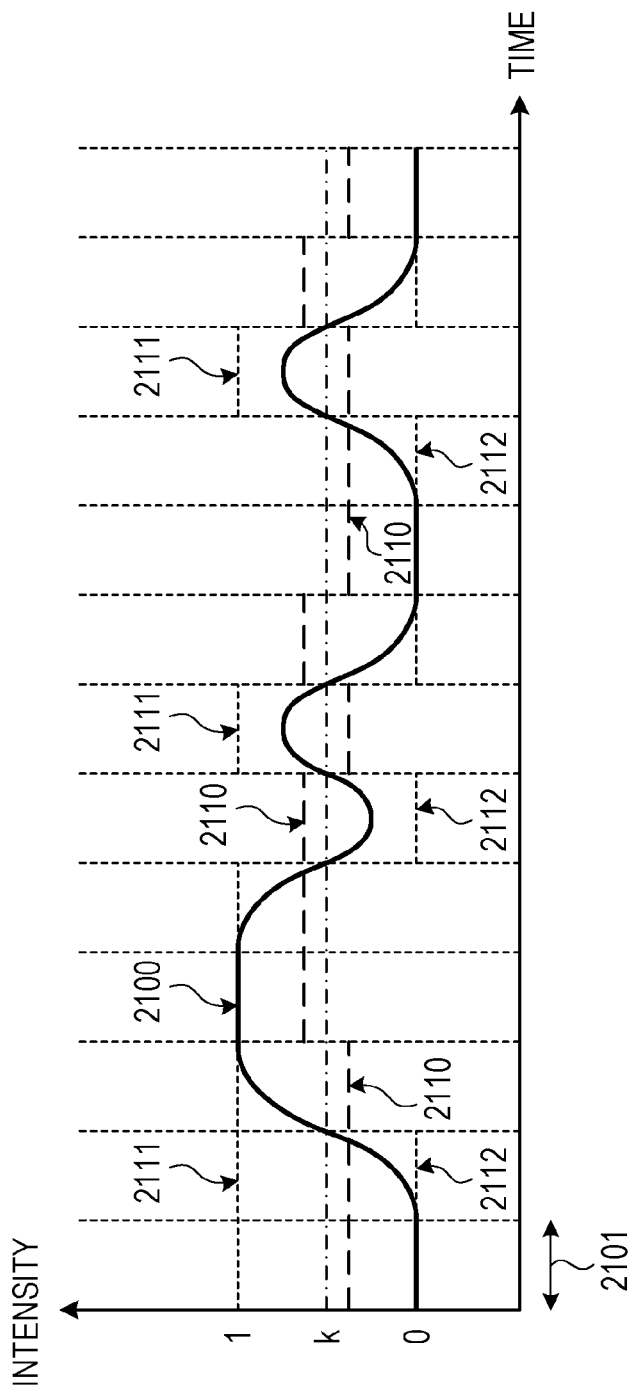
FIG. 21 illustrates an example of the operating characteristic of the decision feedback equalizer circuit illustrated in FIG. 20.

FIG. 21 illustrates an example of the operating characteristic of the decision feedback equalizer circuit illustrated in FIG. 20. In FIG. 21, the abscissa represents the time, and the ordinate represents the intensity of a signal. An operating characteristic curve 2100 indicates the signal input from the equalizer 130 to the subtractor unit 1910. The operating characteristic curve 2100 is obtained from the determination result output from the determination unit 1920. A threshold value 2110 is, for example, a threshold value output from the amplifier 1941 illustrated in FIG. 20. In addition, an interval 2101 indicated by a broken line extending in the vertical direction represents, for example, 1 bit.

As indicated by the operating characteristic curve 2100, a high-frequency component of a signal input to the subtractor unit 1910 attenuates in accordance with the response characteristic of the previous stage. Accordingly, interference between signals occurs so that the level of signal logic (hereinafter simply referred to as "logic") "0" after logic "1" increases and the level of logic "1" after logic "0" decreases. If the intensity of a signal input to the subtractor unit 1910 exceeds the threshold value 2110, an output 2111 of the determination unit is "1". By increasing the threshold value 2110 to higher than a reference value k after a delay of 1 bit, determination of logic "0" after logic "1" is facilitated. In addition, if the intensity of a signal input to the subtractor unit 1910 falls below the threshold value 2110, an output 2112 of the determination unit is "0". By decreasing the threshold value 2110 to lower than the reference value k behind a delay of 1 bit, determination of logic "1" after logic "0" is facilitated.

In this manner, the decision feedback equalizer 1800 can have the function of the discriminator 180 illustrated in FIG. 1. In addition, by delaying the determination result and feeding back the determination result when the intensity of a signal input to the subtractor unit 1910 rises above the reference value or falls below the reference value, the data can be accurately discriminated even when the high-frequency component of the signal input to the subtractor unit 1910 is attenuated.

Figure 22:
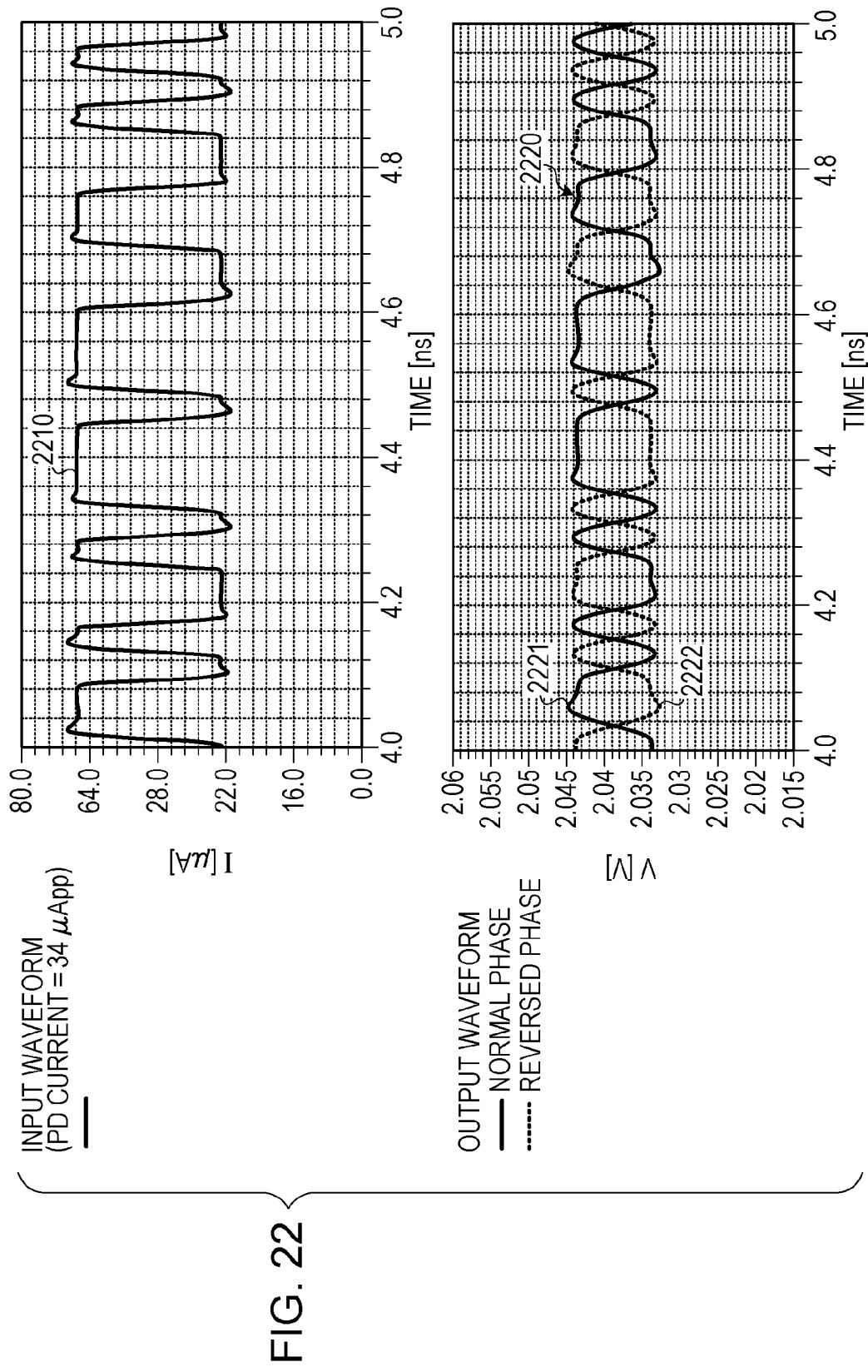
FIG. 22 illustrates examples of input waveform and output waveform of the differential optical front-end.

Examples of the input waveform input to the differential optical front-end 120 and the output waveform output from the differential optical front-end 120 are described next with reference to FIGS. 22 and 23. FIG. 22 illustrates the examples of input waveform and output waveform of the differential optical front-end. As illustrated in FIG. 22, an input waveform 2210 indicates a signal input to the differential optical front-end 120.

A signal input to the differential optical front-end 120 is an electrical signal converted from an optical signal by the photodiode 110. In the graph of the input waveform 2210, the abscissa represents the time (nanosec), and the ordinates represents an electrical current (µA). Note that in the case of small signal input, the input waveform 2210 indicates, for example, 34 µApp (a peak-to-peak value).

In the graph of an output waveform 2220, the abscissa represents the time (nanosec), and the ordinate represents the voltage (V). The output waveform 2220 represents the waveform of a signal output from the differential optical front-end 120. As indicated by the output waveform 2220, the waveform of an in positive signal 2221 and the waveform of a negative signal 2222 are inverted from each other and are symmetrical.

Figure 23:
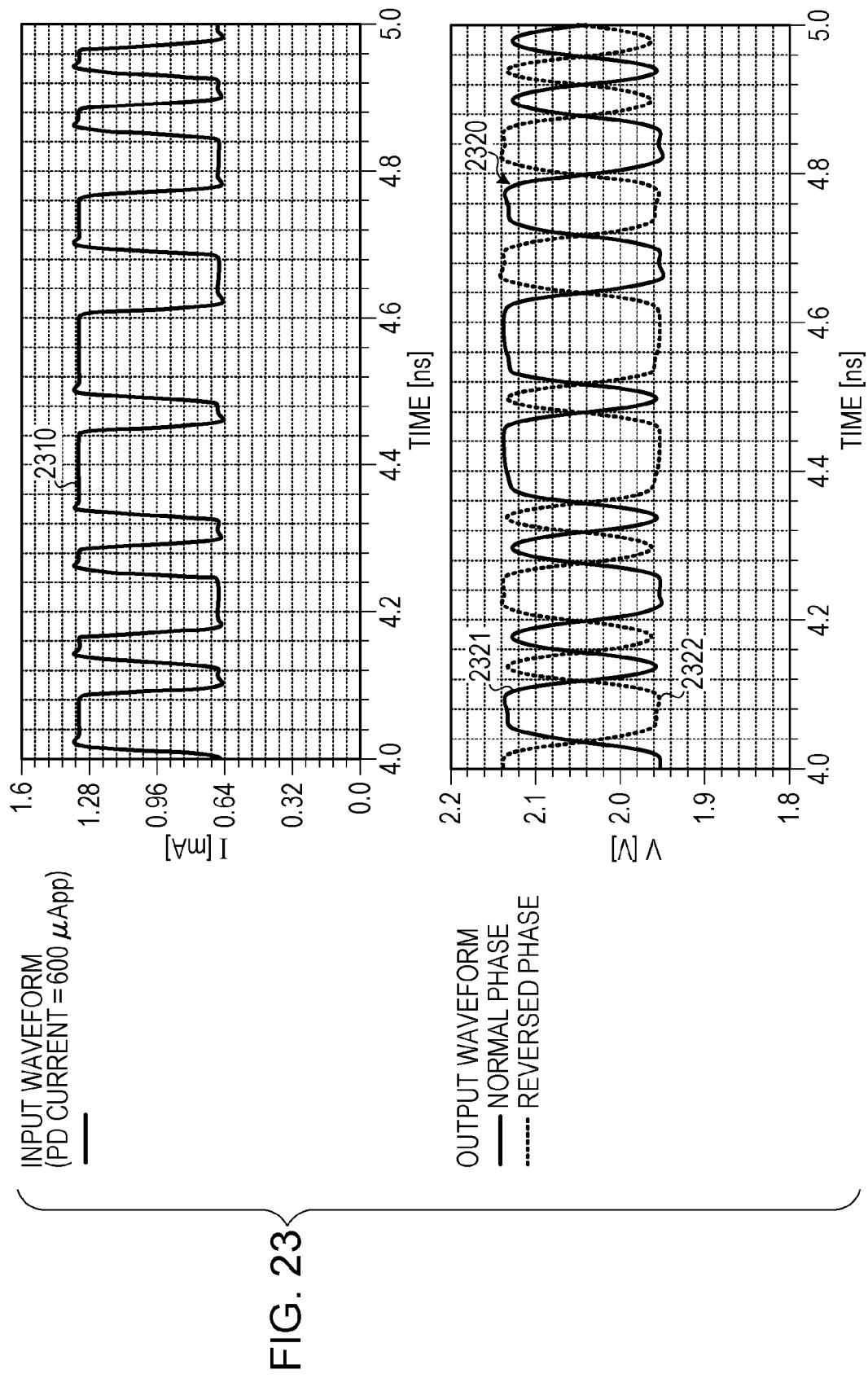
FIG. 23 illustrates another example of the input waveform and output waveform of the differential optical front-end.
Figure 24:
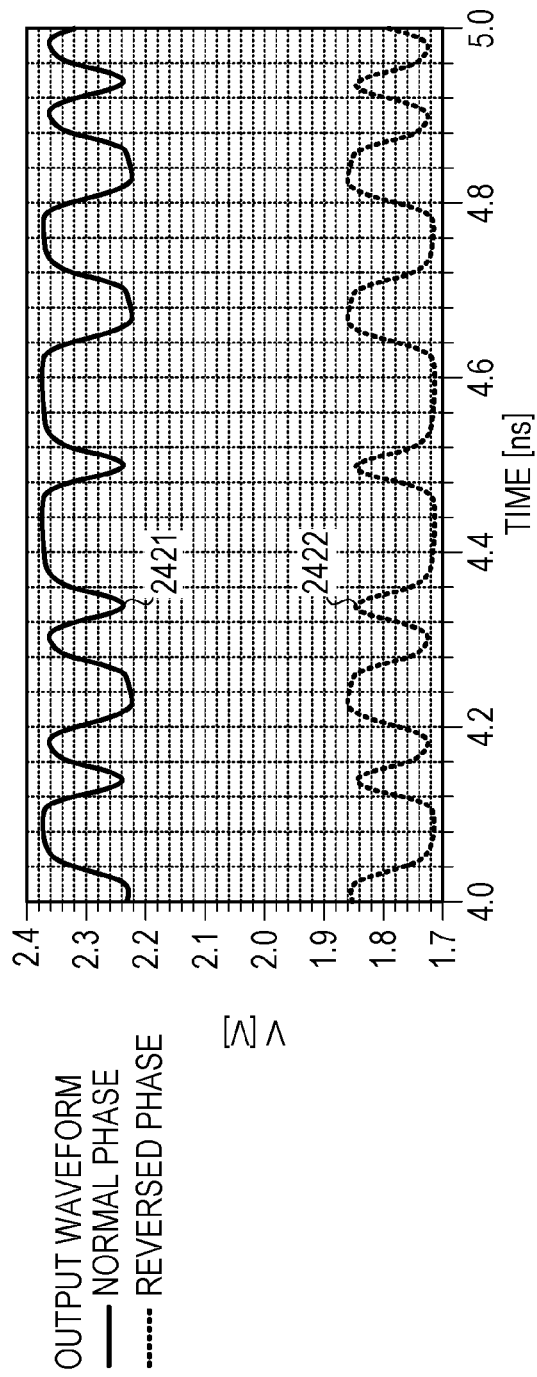
FIG. 24 illustrates, as a reference, an example of an output waveform of a differential optical front-end using a feedback TIA.

FIG. 23 illustrates another example of the input waveform and output waveform of the differential optical front-end. In FIG. 23, the same reference symbols are used for the same configurations as in FIG. 22, and descriptions of the configurations are not repeated. As illustrated in FIG. 23, an input waveform 2310 indicates a signal input to the differential optical front-end 120. In the graph of the input waveform 2310, the abscissa represents the time (nanosec), and the ordinate represents an electrical current (mA). In the case of large signal input, the input waveform 2310 indicates, for example, 600 μApp. An output waveform 2320 indicates the waveform of a signal output from the differential optical front-end 120. As indicated by the output waveform 2320, the waveform of an in positive signal 2321 and the waveform of a negative signal 2322 are inverted from each other and are symmetrical.

In this manner, as illustrated in FIGS. 22 and 23, a linear signal having the in positive signal and the negative signal that are symmetrical can be output from the differential optical front-end 120 regardless of the intensity of an input signal.

As described above, the optical receiving circuit 100 includes the non-feedback TIAs 121 and 122 and the offset compensation unit that inputs an offset current signal to the TIA 122. Accordingly, a signal having the in positive signal and the negative signal that are symmetrical can be output from the differential optical front-end 120 regardless of the intensity of an input signal. As a result, a signal can be output without degrading the linearity.

According to the optical receiving circuit 100 of each of the above-described exemplary embodiments, by inputting, to the TIA 122, an offset current signal based on the in positive signal and the negative signal output from the differential amplifier circuit 123, an offset of the level of the in positive signal from the level of the negative signal can be compensated for. Accordingly, the linearity of a signal in the differential amplifier circuit 123 and the equalizer 130 can be improved. In this manner, noise can be reduced and, thus, the optical reception characteristic can be improved.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. An optical receiving circuit, comprising:
   a first amplifier configured to convert a current signal, which is input at an input side of the first amplifier and which is a result of a reception, performed by an optical receiving element, of an optical signal, into a voltage signal and to output the voltage signal, the output signal not being directly fed back to the input side of the first amplifier;
   a second amplifier configured to convert a current signal, which is input at an input side of the second amplifier, into a voltage signal and to output the voltage signal, the output signal not being directly fed back to the input side of the second amplifier;
   a differential amplifier configured to perform differential amplification on the voltage signal input from the first amplifier and the voltage signal input from the second amplifier and to output an in positive signal and a negative signal obtained through the differential amplification; and
   an offset compensation circuit configured to output to the second amplifier, an offset current signal in accordance with an offset of a level of the in positive signal from a level of the negative signal output from the differential amplifier.

2. The optical receiving circuit according to claim 1, further comprising:
   an equalizing circuit that performs equalization on the in positive signal and the negative signal input from the differential amplifier.

3. The optical receiving circuit according to claim 2, wherein a gain of the equalizing circuit in a first bandwidth is higher than a gain in a second bandwidth that is lower than the first bandwidth.

4. The optical receiving circuit according to claim 2, wherein the equalizing circuit includes an equalizer circuit having a gain versus frequency characteristic in which a frequency of a zero is lower than a frequency of a pole.

5. The optical receiving circuit according to claim 2, wherein the equalizing circuit includes a delaying circuit configured to delay the in positive signal and the negative signal input from the differential amplifier and a computing circuit configured to perform an addition or a subtraction on the signal delayed by the delaying circuit and on the signal input from the differential amplifier.

6. The optical receiving circuit according to claim 2, wherein the equalizing circuit includes a first delaying circuit configured to delay an input signal and a computing circuit configured to perform an addition or a subtraction on the signal delayed by the delaying circuit and on the signal input from the differential amplifier and output a signal obtained through the addition or the subtraction to a second delaying circuit, and
   wherein the signal obtained through the addition or the subtraction is output.

7. The optical receiving circuit according to claim 2, further comprising a subsequent stage equalizing circuit to the equalization circuit,
   wherein the equalizing circuit includes a comparator circuit configured to compare the signal input from the differential amplifier with a threshold value, a determination circuit configured to discriminate data indicated by the optical signal on basis of a comparison made by the comparator circuit, a delaying circuit configured to delay a signal indicating a result of the determination circuit, and an adjustment circuit configured to adjust the threshold value for the comparator circuit in accordance with the signal delayed by the delaying circuit, and
   wherein the offset compensation circuit outputs, to the second amplifier, the offset current signal based on the in positive signal and the negative signal that are input from the differential amplifier prior to input to the subsequent stage equalizing circuit.

8. The optical receiving circuit according to claim 1, wherein the offset compensation circuit includes an extracting circuit configured to extract a low frequency component of the in positive signal and the negative signal that is input from the differential amplifier and that is lower than or equal to a determined frequency, an offset amplifying circuit configured to differential amplify the components of the in positive signal and the negative signal extracted by the extracting circuit, and a resistor provided in series between the offset amplifying circuit and the second amplifier.

9. The optical receiving circuit according to claim 1, wherein the offset compensation circuit includes an offset amplifying circuit configured to differential amplify the in positive signal and the negative signal input from the differential amplifier and output a signal obtained through the differential amplification, an extracting circuit configured to extract a low frequency component of the signal that is input from the offset amplifying circuit and that is lower than or equal to a determined frequency, and resistors provided in series between the extracting circuit and the second amplifier.

10. The optical receiving circuit according to claim 1, wherein the differential amplifier has a feedback path, to an input side of the differential amplifier, through which feedback path an output signal is fed back with a feedback resistor disposed in the feedback path in series.

11. The optical receiving circuit according to claim 1, wherein the first amplifier and the second amplifier include a grounded-base bipolar transistor.

12. The optical receiving circuit according to claim 1, wherein the first amplifier and the second amplifier include a grounded-gate field-effect transistor.

13. The optical receiving circuit according to claim 1, wherein the first amplifier and the second amplifier include an inductor in an input circuit.

* * * * *